(12) United States Patent  
Iiyama et al.

(10) Patent No.: US 8,845,119 B2  
(45) Date of Patent: Sep. 30, 2014

(54) LIGHT EMITTING DEVICE, SURFACE LIGHT SOURCE, AND LIQUID CRYSTAL DISPLAY APPARATUS

(75) Inventors: Tomoko Iiyama, Osaka (JP); Motonobu Yoshikawa, Osaka (JP); Daizaburo Matsuki, Osaka (JP)

(73) Assignee: Panasonic Corporation, Osaka (JP)

( * ) Notice: Subject to any disclaimer, the term of this patent is extended or adjusted under 35 U.S.C. 154(b) by 226 days.

(21) Appl. No.: 13/202,958

(22) PCT Filed: Jan. 21, 2011

(86) PCT No.: PCT/JP2011/000326  
§ 371 (c)(1),  
(2), (4) Date: Aug. 23, 2011

(87) PCT Pub. No.: WO2011/114608  
PCT Pub. Date: Sep. 22, 2011

(65) Prior Publication Data  
US 2012/0057101 A1 Mar. 8, 2012

(30) Foreign Application Priority Data  
Mar. 15, 2010 (JP) ................................. 2010-057719

(51) Int. Cl.  
*G09F 13/04* (2006.01)  
*G02B 13/08* (2006.01)  
*H01L 33/58* (2010.01)  
*G02F 1/1335* (2006.01)

(52) U.S. Cl.  
CPC .................. *G02B 13/08* (2013.01); *H01L 33/58* (2013.01); *G02F 1/133603* (2013.01)  
USPC ......................................... 362/97.3; 313/116

(58) Field of Classification Search  
USPC ........................................... 362/97.3; 313/116  
See application file for complete search history.

(56) References Cited

U.S. PATENT DOCUMENTS

| | | | |
|---|---|---|---|
| 6,637,905 B1* | 10/2003 | Ng et al. ......................... | 362/601 |
| 7,348,723 B2 | 3/2008 | Yamaguchi et al. | |
| 7,597,459 B2 | 10/2009 | Maeda et al. | |
| 7,710,016 B2 | 5/2010 | Miki et al. | |
| 2002/0067549 A1* | 6/2002 | Tawa et al. ..................... | 359/642 |
| 2006/0083000 A1* | 4/2006 | Yoon et al. ..................... | 362/311 |
| 2008/0002412 A1 | 1/2008 | Tanaka et al. | |
| 2008/0007939 A1* | 1/2008 | Lee et al. ......................... | 362/97 |

(Continued)

FOREIGN PATENT DOCUMENTS

| | | |
|---|---|---|
| JP | 2002-042368 | 2/2002 |
| JP | 2006-258899 | 9/2006 |

(Continued)

*Primary Examiner* — Andrew Coughlin  
(74) *Attorney, Agent, or Firm* — Hamre, Schumann, Mueller & Larson, P.C.

(57) ABSTRACT

A light emitting device (1) is configured to radiate light with an optical axis A at the center, and is provided with a light source (2), and a lens (3) that radially expands the light from light source (2). The light source (2) has a light emitting surface (21) extending in an X direction orthogonal to the optical axis A. The lens (3) is configured to have a greater refractive power in a Y direction orthogonal to the X direction than in the X direction. For example, the lens (3) has a light entrance surface (31) including an anamorphic curved surface with different curve forms between the X direction and the Y direction.

6 Claims, 30 Drawing Sheets

(56) References Cited

U.S. PATENT DOCUMENTS

2008/0198594 A1* 8/2008 Lee ................................ 362/231
2008/0239722 A1* 10/2008 Wilcox .......................... 362/268
2009/0129084 A1    5/2009 Tsao
2010/0232166 A1* 9/2010 Ho et al. ........................ 362/335

FOREIGN PATENT DOCUMENTS

| JP | 3875247 | 11/2006 |
| JP | 2008-010693 | 1/2008 |
| JP | 2009-123803 | 6/2009 |

* cited by examiner

FIG.1
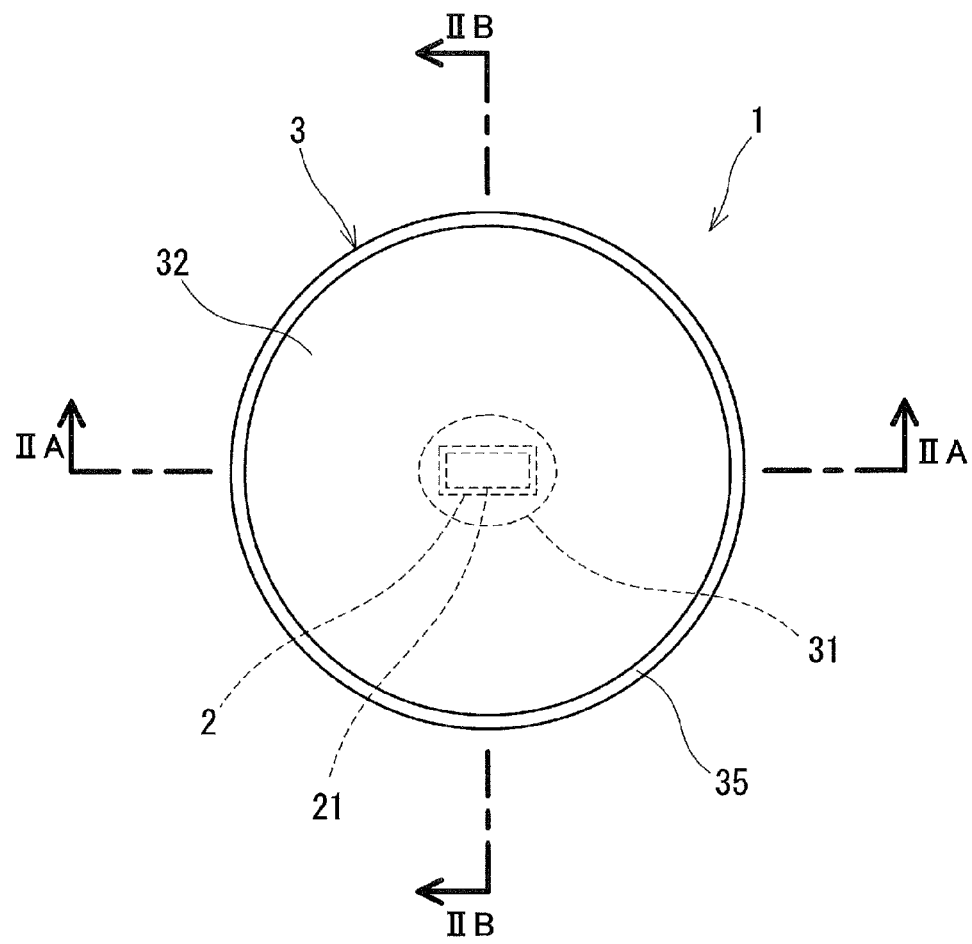
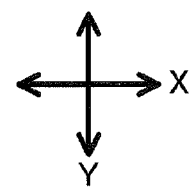

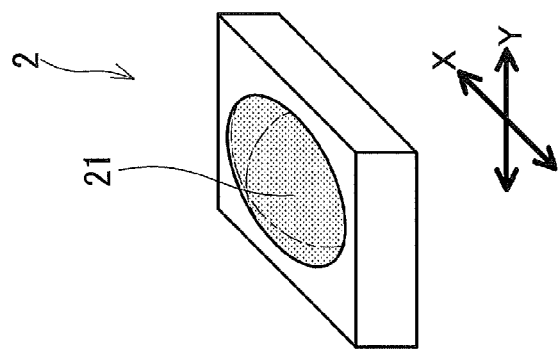
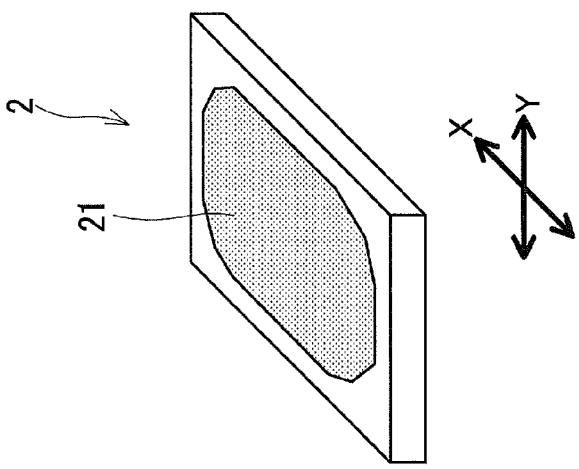
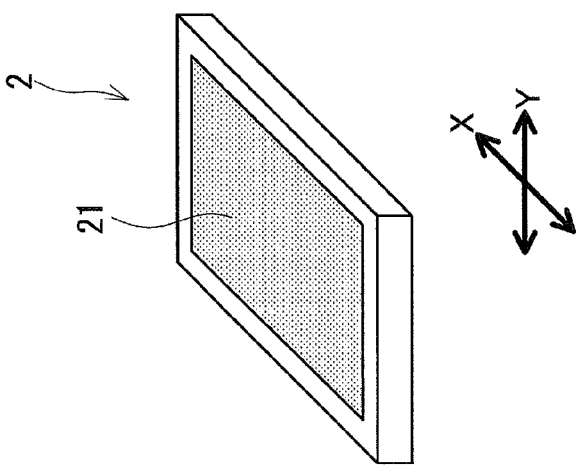

Example 1 (aspect ratio of light emitting surface: 2.6)

Example 1 (aspect ratio of light emitting surface: 2.6)

Example 2 (aspect ratio of light emitting surface: 2.0)

Example 2 (aspect ratio of light emitting surface: 2.0)

Example 3 (aspect ratio of light emitting surface: 1.8)

Example 3 (aspect ratio of light emitting surface: 1.8)

Example 4 (aspect ratio of light emitting surface: 1.3)

Example 4 (aspect ratio of light emitting surface: 1.3)

Reference Example 1
(aspect ratio of light emitting surface: 2.0)

Distance from optical axis on illumination target surface [mm]

Reference Example 2
(aspect ratio of light emitting surface: 2.8)

Distance from optical axis on illumination target surface [mm]

Example 5 (aspect ratio of light emitting surface: 2.0)

Example 5 (aspect ratio of light emitting surface: 2.0)

LIGHT EMITTING DEVICE, SURFACE LIGHT SOURCE, AND LIQUID CRYSTAL DISPLAY APPARATUS

TECHNICAL FIELD

The present invention relates to a light emitting device that widens the directionality of light from a light source such as a light emitting diode (hereinafter, simply referred to as an "LED"). The present invention further relates to a surface light source provided with a plurality of light emitting devices, and to a liquid crystal display apparatus provided with this surface light source disposed behind a liquid crystal panel as a backlight.

BACKGROUND ART

Conventionally, in a backlight for large-sized liquid crystal display apparatuses, a number of cold cathode tubes are disposed immediately below a liquid crystal panel to be used with other members such as a diffusing plate and a reflecting plate. In recent years, LEDs have been used in common as light sources for backlights. LEDs are expected to serve as low-power light sources to replace fluorescent lamps, due to the recent improvement in their efficiency. When LEDs are used as light sources in a liquid crystal display apparatus, the power consumption of the liquid crystal display apparatus can be reduced by controlling the brightness of the LEDs according to the image to be displayed.

When LEDs are used as light sources for a backlight in a liquid crystal display apparatus, a large number of LEDs are to be provided instead of cold cathode tubes. Although the use of such a large number of LEDs may allow uniform brightness on the front surface of the backlight, the need for a large number of LEDs makes it difficult to reduce the cost, which is a problem. Attempts have been made to increase the output power of each LED to reduce the required number of LEDs. For example, Patent Literature 1 proposes a light emitting device that is designed to provide a uniform surface light source even with a reduced number of LEDs.

In order to obtain a uniform surface light source with a reduced number of LEDs, it is necessary to increase the illumination area that can be illuminated by each LED. To achieve this, the light emitting device of Patent Literature 1 uses a lens that radially expands the light from an LED. This widens the directionality of the light from the LED, thus enabling a wider range on the illumination target surface to be illuminated, with the optical axis being at the center. Specifically, the lens used for the light emitting device of Patent Literature 1 is circular in plan view, in which both a light entrance surface that is concave, and a light exit surface that is concave in the vicinity of the optical axis and is convex on the circumference thereof, are rotationally symmetric with respect to the optical axis.

Meanwhile, Patent Literature 2 discloses a light emitting device using a lens that has a light exit surface in the middle of which a V-shaped groove extending in a direction orthogonal to the optical axis is formed. According to the lens of this light emitting device, the light from the LED is expanded while the angular distribution remains a normal distribution in the direction in which the V-shaped groove extends (in the longitudinal direction). However, in the direction orthogonal to the direction in which the V-shaped groove extends (in the width direction), the light is expanded such that the angular distribution significantly drops in the vicinity of the optical axis and steeply rises on both lateral sides.

CITATION LIST

Patent Literature

Patent Literature 1: JP 3875247 B2
Patent Literature 2: JP 2008-10693 A

SUMMARY OF INVENTION

Technical Problem

Many of the LEDs that have increased their efficiency recently have a light emitting surface extending in a specific direction. Such an LED having a non-symmetric light emitting surface has different brightness distributions between the length direction (hereinafter, referred to as the "longitudinal direction" in this paragraph) and the width direction (hereinafter, referred to as the "width direction" in this paragraph) on the light emitting surface. Therefore, in the case where such an LED is employed in the light emitting device of Patent Literature 1 that uses a lens having a light entrance surface and a light exit surface that are rotationally symmetric, when a relatively large lens is used, the distance from the LED to the light entrance surface is large enough and thus there is not much difference in illuminance distribution between the longitudinal direction and the width direction on the illumination target surface. However, when a relatively small lens is used, the distance from the LED to the light entrance surface is shortened, resulting in a significant difference in illuminance distribution between the longitudinal direction and the width direction on the illumination target surface.

The light emitting device is desired to radiate light that is symmetric with respect to the optical axis in all the directions, in other words, light that is not anisotropic, even when using a light source having a non-symmetric light emitting surface. Further, in order to achieve a reduction in the thickness of the backlight and a reduction in cost of the light emitting device, radiation of light that has been made uniform in the circumferential direction is desirably enabled, while using a relatively small lens.

The light emitting device of Patent Literature 2 is intended to intentionally produce anisotropy in the radiated light, and is not something that satisfies the above-mentioned requirements.

In view of the above-mentioned requirements, it is an object of the present invention to provide a light emitting device capable of making the light from a light source having a non-symmetric light emitting surface uniform in the circumferential direction and radiating it while using a relatively small lens, and to provide a surface light source and a liquid crystal display apparatus that include this light emitting device.

Solution to Problem

In order to solve the problems, the present invention provides a light emitting device for radiating light with an optical axis being at the center. The light emitting device includes a light source having a light emitting surface that extends in a first direction orthogonal to the optical axis, and a lens for radially expanding the light from the light source. The lens has a greater refractive power in a second direction that is orthogonal to the optical axis and the first direction than in the first direction.

The present invention further provides a surface light source including a plurality of light emitting devices arranged in a plane and a diffusing plate disposed to cover the plurality of light emitting devices. The diffusing plate radiates the illuminating light, emitted by the plurality of light emitting devices to its one surface, from its other surface in a diffused state. Each of the plurality of light emitting devices is the above-described light emitting device.

Furthermore, the present invention provides a liquid crystal display apparatus including a liquid crystal panel and the above-described surface light source disposed behind the liquid crystal panel.

Advantageous Effects of Invention

According to the above-mentioned configuration, the refractive power of the lens in the length direction of the light emitting surface of the light source is greater than that in the direction orthogonal to the length direction, and thus the anisotropy of the light from the light source is reduced by the lens. Therefore, according to the present invention, it is possible to make the light from a light source having a non-symmetric light emitting surface uniform in the circumferential direction and radiate it while using a relatively small lens.

BRIEF DESCRIPTION OF DRAWINGS

FIG. 1 is a plan view showing a light emitting device according to Embodiment 1 of the present invention.

FIGS. 3A to 3C are perspective views showing specific examples of a light source.

DESCRIPTION OF EMBODIMENTS

Hereinafter, the embodiments of the present invention are described with reference to the drawings.

Embodiment 1

Figure 2A:
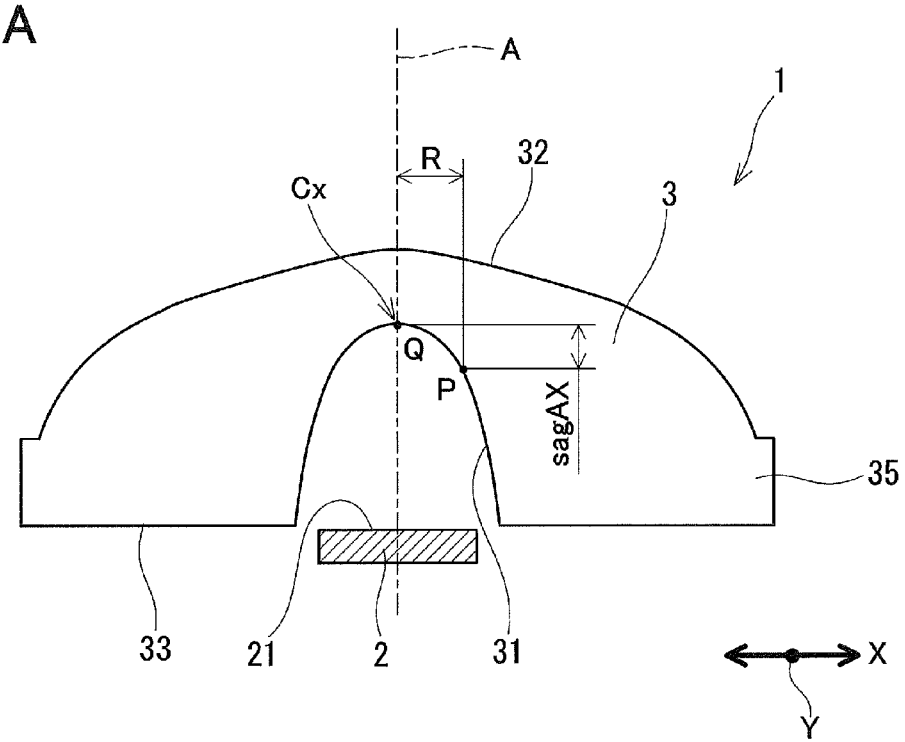
FIG. 2A is a sectional view taken along the line IIA-IIA in FIG. 1.
Figure 2B:
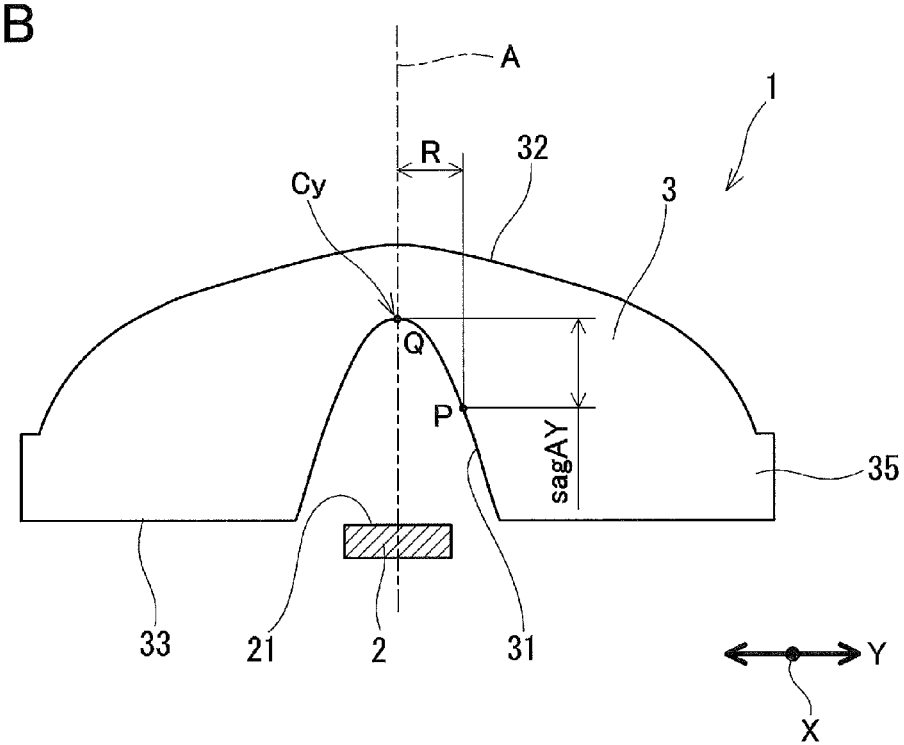
FIG. 2B is a sectional view taken along the line IIB-IIB in FIG. 1.

FIG. 1, and FIGS. 2A and 2B each show a light emitting device 1 according to Embodiment 1 of the present invention. The light emitting device 1, for example, is configured to radiate light onto the illumination target surface in a substantially circular manner, with an optical axis A being at the center, and is provided with a light source 2, and a lens 3 that expands the light from the light source 2 radially. That is, the directionality of the light from the light source 2 is widened by the lens 3, thereby allowing a wide range of the illumination target surface to be illuminated, with the optical axis A being at the center. The illuminance distribution on the illumination target surface reaches its peak on the optical axis A, and almost monotonically decreases toward the circumference.

The light source 2 has a light emitting surface 21 extending in a first direction orthogonal to the optical axis A. Thus, the light source 2 radiates anisotropic light. In this description, the first direction is referred to as an X direction, and the second direction that is orthogonal to the first direction and the optical axis A is referred to as a Y direction, for convenience of description.

In this embodiment, an LED that is a light emitting element and in the form of a chip is employed as the light source 2, and the light emitting surface 21 is composed of a flat surface of such an LED. The light emitting surface 21 is not specifically limited in shape, as long as it extends in the X direction. For example, the light emitting surface 21 may be rectangular as shown in FIG. 3A, or may be oblong as shown in FIG. 3B. Furthermore, the light source 2 is not necessarily constituted only by the LED. It may be constituted, for example, by an LED and a phosphor layer formed on the LED in a dome shape, and the light emitting surface 21 may be composed of a three-dimensional surface of the phosphor layer, as shown in FIG. 3C.

Light emission does not have directivity inside the LED, but the light emitting region thereof has a refractive index of 2.0 or more. Therefore, when light enters a region having a low refractive index, the light has the maximum intensity in the normal direction of the interface, while the intensity of the light decreases as the angle with respect to the normal direction increases, under the influence of refraction at the interface. As described above, the LED has a directivity, and thus it is necessary to widen the directionality of the light from the LED by the lens 3, in order to illuminate a wider range on the illumination target surface.

Figure 4:
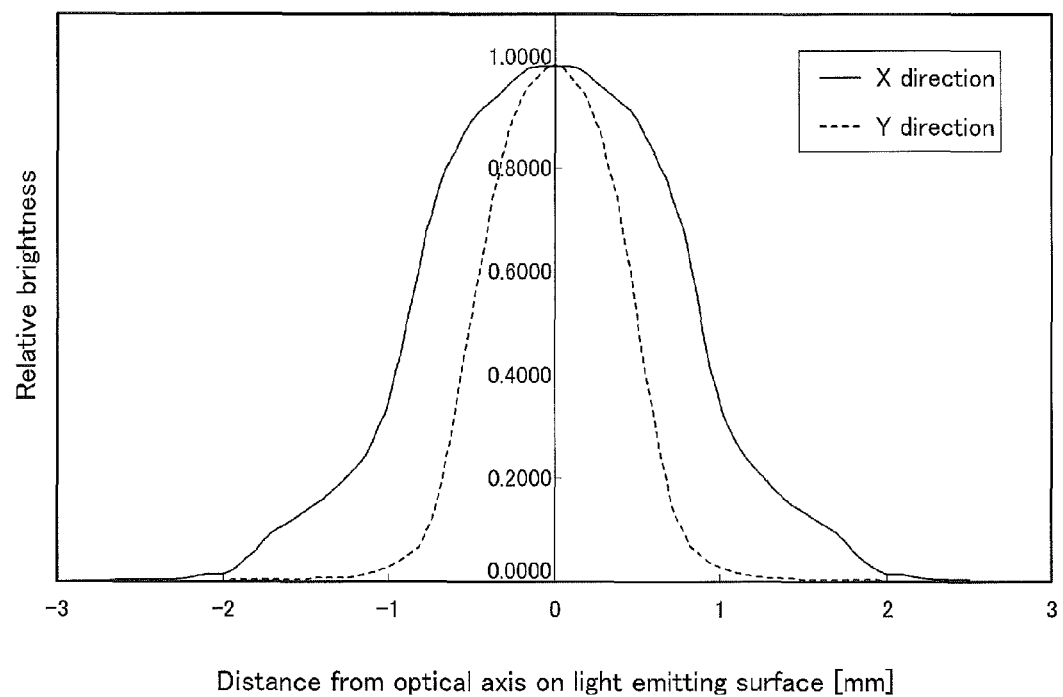
FIG. 4 shows a brightness distribution on the light emitting surface of the light source used for the light emitting device shown in FIG. 1.

FIG. 4 shows the brightness distribution along the line extending in the X direction passing through the optical axis A on the light emitting surface 21 of the light source 2, and the brightness distribution along the line extending in the Y direction passing through the optical axis A thereon. As shown in FIG. 4, the light emitting surface 21 has different brightness distributions between the X direction and the Y direction, because of its shape that extends in the X direction. Specifically, the brightness distribution in the X direction is broader than the brightness distribution in the Y direction. In this way, light that is non-symmetric with respect to the optical axis A, in other words anisotropic light, is radiated from the light source 2.

The lens 3 is made of a transparent material having a specific refractive index. The transparent material has a refractive index, for example, of about 1.4 to 2.0. A rubber such as silicon rubber, glass, or a resin such as epoxy resin, silicone resin, acrylic resin, and polycarbonate can be used as such a transparent material. Above all, it is preferable to use an epoxy resin, a silicon rubber, or the like, that conventionally has been used as a sealing resin for LEDs.

Specifically, as shown in FIGS. 2A and 2B, the lens 3 has a light entrance surface 31 that allows the light from the light source 2 to enter the lens 3 therethrough, and a light exit surface 32 that allows the light that has entered the lens 3 to exit the lens 3 therethrough. The outermost diameter of the light exit surface 32 defines the effective diameter of the lens 3. Further, the lens 3 has a bottom surface 33 oriented opposite to the light exit surface 32 around the light entrance surface 31. Moreover, in this embodiment, a ring portion 35 projecting outward in the radial direction is provided between the light exit surface 32 and the bottom surface 33, and the peripheral edge of the light exit surface 32 and the outer peripheral edge of the bottom surface 33 are connected via the outer surface of this ring portion 35 with a substantially U-shaped cross section. However, the ring portion 35 may be omitted. In that case, the peripheral edge of the light exit surface 32 and the outer peripheral edge of the bottom surface 33 may be connected via an edge surface with a linear or arcuate cross section.

The light entrance surface 31, in this embodiment, is a continuous concave surface. The light source 2 is spaced from the light entrance surface 31 of the lens 3. The light exit surface 32, in this embodiment, is a continuous convex surface that is rotationally symmetric with respect to the optical axis A. The bottom surface 33 in the form of a ring surrounding the light entrance surface 31 preferably is flat. In this embodiment, the light emitting surface 21 of the light source 2 and the bottom surface 33 that is flat are positioned at almost the same level in the light axis direction in which the optical axis A extends.

The light from the light source 2 enters the lens 3 through the light entrance surface 31, and thereafter exits the lens 3 through the light exit surface 32 to reach the illumination target surface, which is not shown. The light emitted from the light source 2 is expanded due to the refraction effects of the light entrance surface 31 and the light exit surface 32 so as to reach a wide range on the illumination target surface.

Further, the lens 3 also serves to make the anisotropic light radiated from the light source 2 uniform in the circumferential direction. In order to achieve this, the lens 3 is configured so as to have a greater refractive power in the Y direction than in the X direction. In this embodiment, the light entrance surface 31 includes an anamorphic curved surface having different curve forms between the X direction and the Y direction, thereby allowing the refractive power in the Y direction to be greater than the refractive power in the X direction. Moreover, the entire area of the light entrance surface 31 is such a curved surface in this embodiment.

Specifically, the light entrance surface 31 has a vertex Q on the optical axis A. The light entrance surface 31 has a shape such that, when the distance along the optical axis A from the vertex Q to the point P on the light entrance surface 31 (that is, the distance in the light axis direction) is taken as a sag amount (having a negative sign on the side of the light source 2 with respect to the vertex Q and a positive sign on the opposite side of the light source 2 with respect to the vertex Q), the sag amount sagAX in the X direction is greater than the sag amount sagAY in the Y direction at the same distance R from the optical axis A in the radial direction (that is, on the same circumference with the optical axis A being at the center). Although the light entrance surface 31 may extend toward the light source 2 after stepping back once toward the opposite side of the light source 2 from the vertex Q so that the sag amount is positive in the vicinity of the optical axis A, it preferably extends only toward the light source 2 from the vertex Q so that the sag amount is negative throughout the entire area.

Also, when the light entrance surface 31 extends only toward the light source 2 from the vertex Q, the shape of the light entrance surface 31 can be expressed in terms of the curvature Cx (one divided by the radius of curvature) at the intersecting portion with the optical axis A on the cross section in the X direction being smaller than the curvature Cy at the intersecting portion with the optical axis A on the cross section in the Y direction.

In the light emitting device 1 as described above, the anisotropy of the light from the light source 2 is reduced by the lens 3. Accordingly, it is possible to make the light from the light source 2 having the non-symmetric light emitting surface 21 uniform in the circumferential direction and radiate it, while using the lens 3 that is relatively small.

Meanwhile, the sag difference sagD obtained by subtracting the sag amount sagAY in the Y direction from the sag amount sagAX in the X direction preferably increases as the distance from the optical axis A increases. This is because, in that case, it is possible to suppress the brightness unevenness to a small extent, even if there is a positional misalignment in the rotational direction between the light source 2 and the lens 3, with the optical axis A being at the center.

Moreover, the sag difference sagD at that time preferably increases outward in the radial direction in such a way as to satisfy the following conditional expression:

$$0.12(F-1)^2 \leq S \leq 3 \log_{10} F.$$

Figure 17:
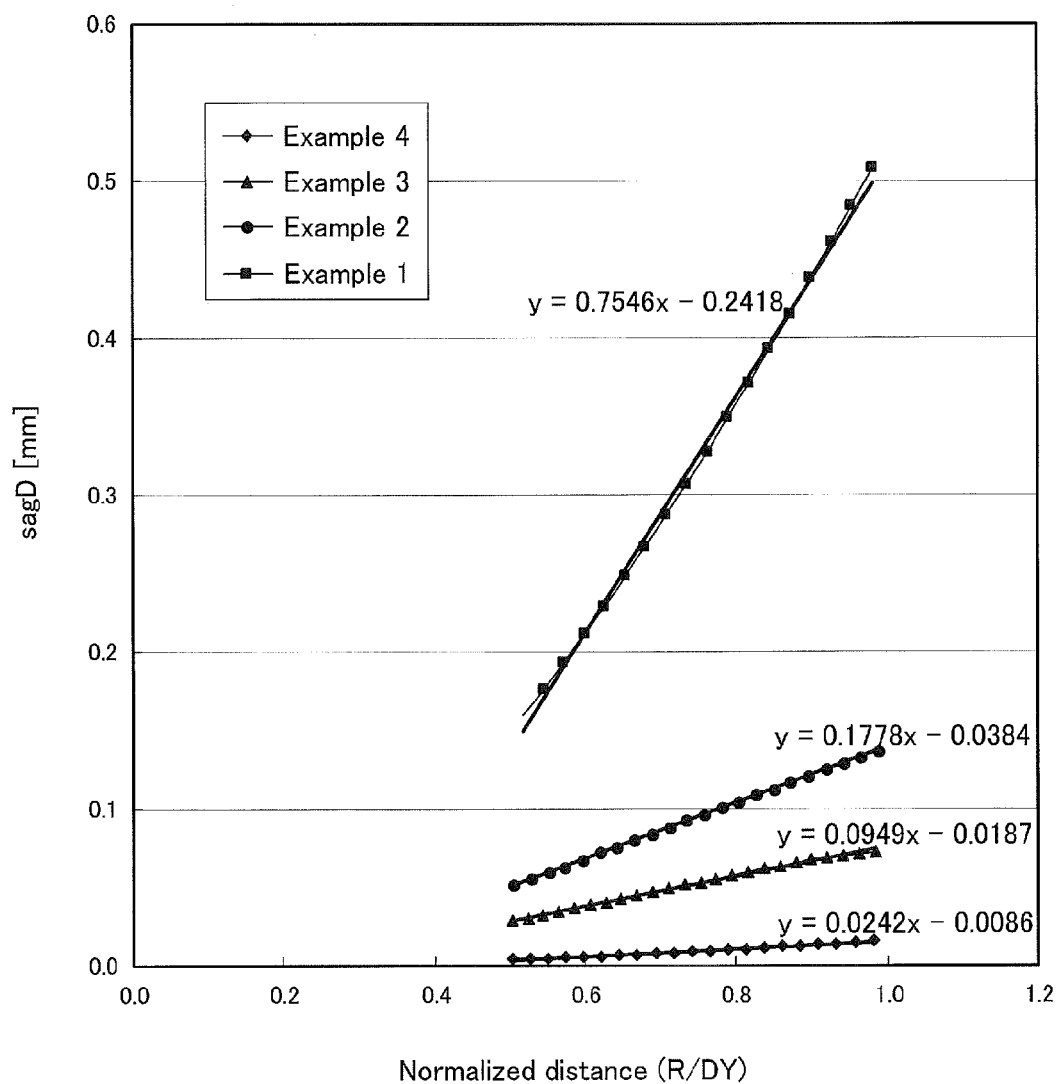
FIG. 17 is a graph showing a curve of the sag difference in the range of normalized distance of 0.5 or more and an approximated straight line for this curve in Examples 1 to 4.

In the formula, F denotes the aspect ratio of the light emitting surface that is a ratio (L/W) of the length L of the light emitting surface 21 in the X direction with respect to the width W of the light emitting surface 21 in the Y direction, and S denotes the slope of an approximated straight line obtained by first normalizing the distance R from the optical axis A with the maximum radius DY of the light entrance surface 31 in the Y direction to obtain a normalized distance (R/DY), and then linearly approximating the curve of the sag difference sagD in the range of the normalized distance of 0.5 or more, using the least-squares method (see FIG. 17).

Figure 18:
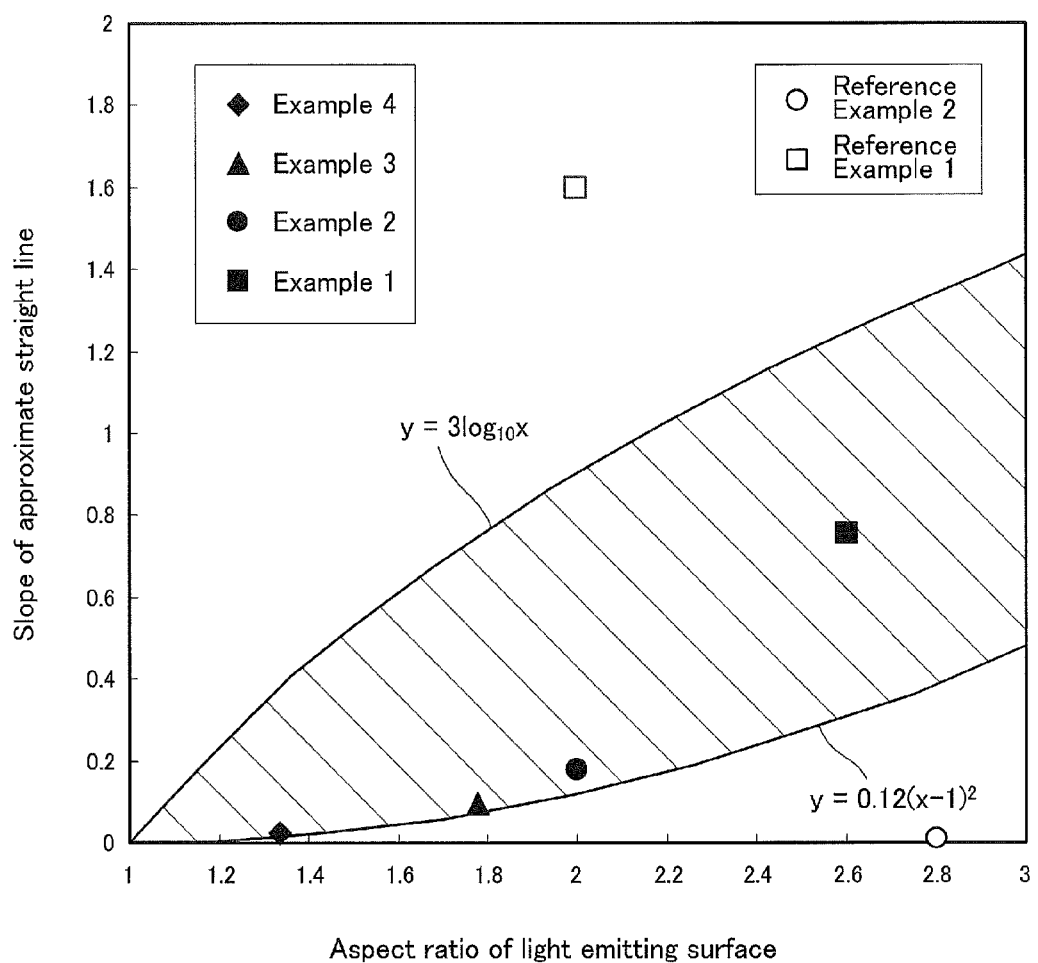
FIG. 18 is a graph showing the range specified by a conditional expression, and demonstrating that Examples 1 to 4 fall within this range.

As shown in FIG. 18, when the aspect ratio of the light emitting surface is taken as the x axis, and the slope of the approximated straight line is taken as the y axis, the area specified by the above-mentioned conditional expression is shown by the hatched region in FIG. 18. When the slope of the approximated straight line is below or above the hatched region, the shape of light distribution is deformed and the brightness uniformity is deteriorated. Therefore, the above-mentioned conditional expression is preferably satisfied.

<Modified Example>

The light exit surface 32 that is rotationally symmetric with respect to the optical axis A is not necessarily convex over the entire area. For example, it may have a portion with a concave surface in the vicinity of the optical axis and a portion with a convex surface in the circumference thereof. Alternatively, the light exit surface 32 may have a portion with a flat surface in the vicinity of the optical axis.

In this embodiment, only the light entrance surface 31 includes an anamorphic aspherical curved surface. However, in order to obtain a lens having a greater refractive power in the Y direction than in the X direction, at least one of the light entrance surface 31 and the light exit surface 32 should include an anamorphic aspherical curved surface.

Figure 5A:
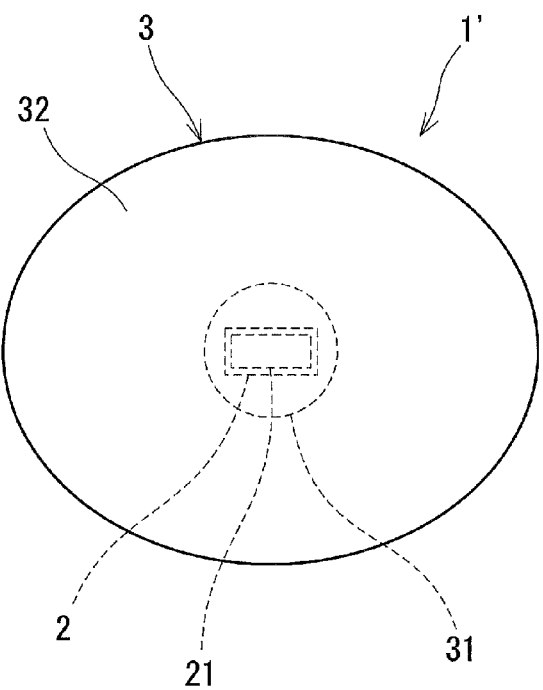
FIGS. 5A and 5B are plan views showing light emitting devices of modified examples.

For example, as shown in FIG. 5A, a configuration in which the light entrance surface 31 is a continuous concave surface that is rotationally symmetric with respect to the optical axis A, and the light exit surface 32 is a convex surface that includes an anamorphic aspherical curved surface may be employed. In this configuration, the light entrance surface 31 may be flat, and the light emitting surface 21 of the light source 2 may be optically joined to the light entrance surface 31 via a joint member. Further, in the case where the light entrance surface 31 is flat, the light entrance surface 31 may have the same shape as the light emitting surface 21 instead of being rotationally symmetric.

Figure 5B:
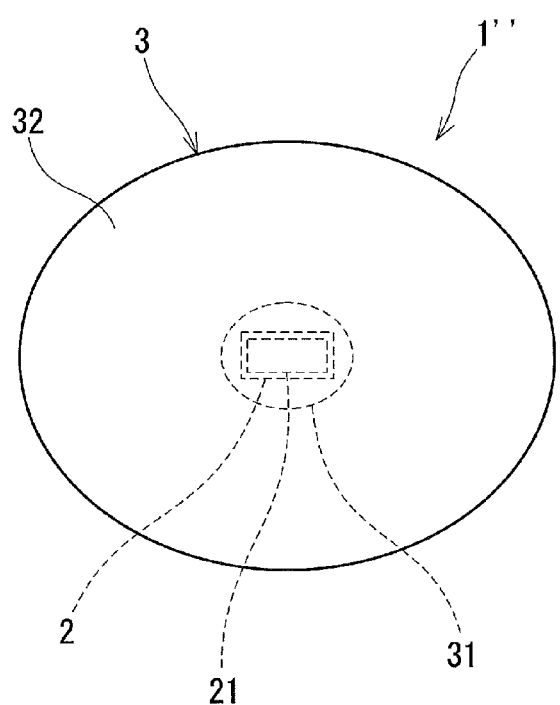

Alternatively, as shown in FIG. 5B, both the light entrance surface 31 and the light exit surface 32 may include an anamorphic aspherical curved surface.

Furthermore, the light emitting element to be used for the light source 2 is not necessarily an LED, and may be an organic EL, for example.

EXAMPLES

Hereinafter, Examples 1 to 5 of the light emitting device 1 are described as a specific numerical example of the present invention.

Figure 6:
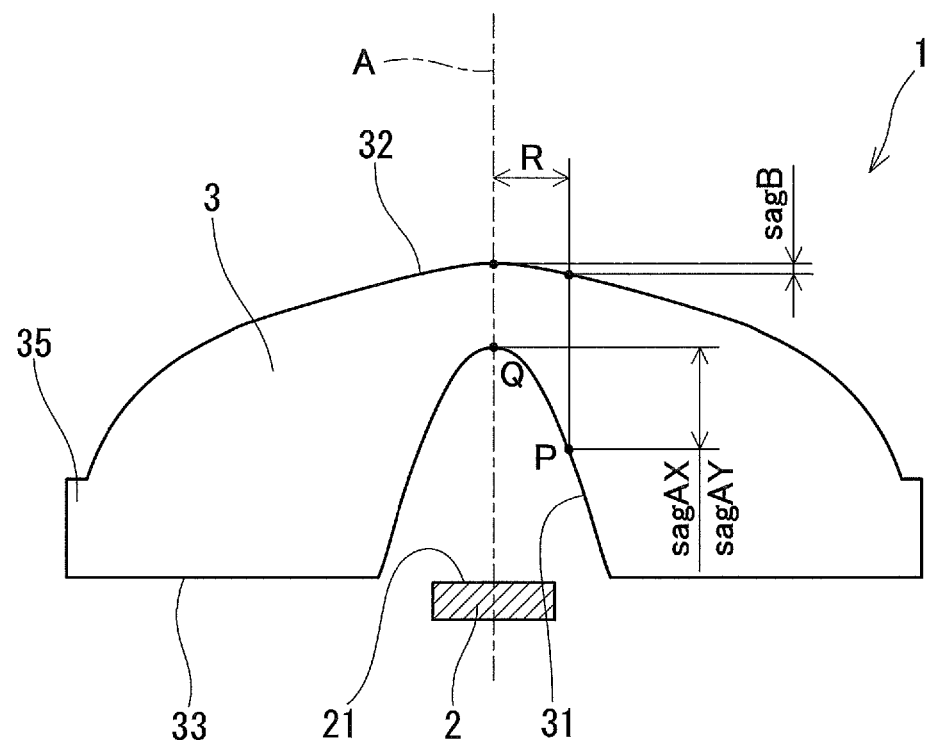
FIG. 6 is a view for illustrating the light emitting devices of Examples 1 to 4.
Figure 21:
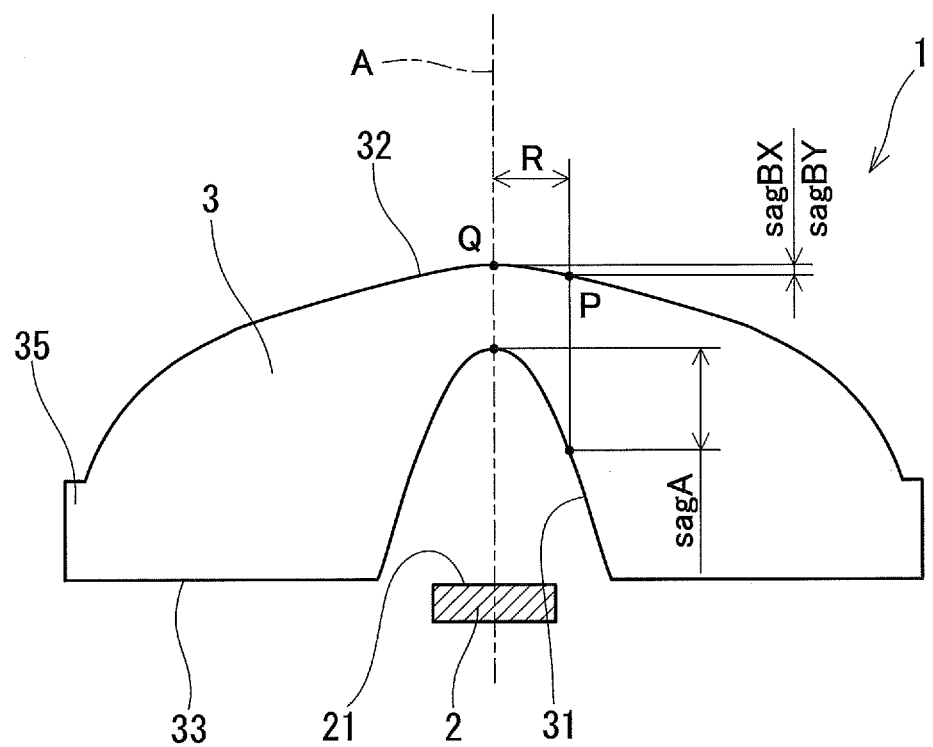
FIG. 21 is a view for illustrating a light emitting device of Example 5.

FIG. 6 is a view illustrating the light emitting devices of Examples 1 to 4, and FIG. 21 is a view illustrating the light emitting device of Example 5. Examples 1 to 4 employ the lens 3 in which the entire area of the light entrance surface 31 is an anamorphic curved surface and the light exit surface 32 is rotationally symmetric. Example 5 employs the lens 3 in which the entire area of the light exit surface 32 is an anamorphic curved surface and the light entrance surface 31 is rotationally symmetric.

In FIG. 6, Q, P, sagAX and sagAY are identical to those shown in FIGS. 2A and 2B. Further, sagB in FIG. 6 denotes the sag amount of the light exit surface 32 at the distance R from the optical axis A. In FIG. 21, Q denotes the vertex of the light exit surface 32 on the optical axis A, P denotes a point on the light exit surface 32 at the distance R from the optical axis A, sagBX denotes the sag amount (the distance along the optical axis A from the vertex Q to the point P) on the light exit surface 32 in the X direction, and sagBY denotes the sag amount of the light exit surface 32 in the Y direction. Further, sagA in FIG. 21 denotes the sag amount of the light entrance surface 31 at the distance R from the optical axis A.

Example 1

Example 1 is a design example intended to widen the directionality of the light from the light source 2 by employing, as the light source 2, a general-purpose LED in which the light emitting surface 21 has a length of 2.60 mm in the X direction and a width of 1.00 mm in the Y direction. In Example 1, the lens 3 has an effective diameter of 15 mm. Table 1 shows specific numerical values for Example 1.

TABLE 1

| R | sagAX (mm) | R | sagAY (mm) | R | sagB (mm) |
|---|---|---|---|---|---|
| 0.00 | 0.000 | 0.00 | 0.000 | 0.00 | 0.000 |
| 0.05 | −0.002 | 0.05 | −0.003 | 0.10 | 0.000 |
| 0.10 | −0.010 | 0.10 | −0.013 | 0.20 | −0.002 |
| 0.15 | −0.022 | 0.15 | −0.030 | 0.30 | −0.006 |
| 0.20 | −0.040 | 0.20 | −0.054 | 0.40 | −0.013 |
| 0.25 | −0.062 | 0.25 | −0.084 | 0.50 | −0.023 |
| 0.30 | −0.090 | 0.30 | −0.120 | 0.60 | −0.037 |
| 0.35 | −0.122 | 0.35 | −0.164 | 0.70 | −0.053 |
| 0.40 | −0.159 | 0.40 | −0.214 | 0.80 | −0.072 |
| 0.45 | −0.201 | 0.45 | −0.270 | 0.90 | −0.093 |
| 0.50 | −0.248 | 0.50 | −0.333 | 1.00 | −0.116 |
| 0.55 | −0.300 | 0.55 | −0.402 | 1.10 | −0.141 |
| 0.60 | −0.357 | 0.60 | −0.478 | 1.20 | −0.166 |
| 0.65 | −0.418 | 0.65 | −0.560 | 1.30 | −0.193 |
| 0.70 | −0.485 | 0.70 | −0.648 | 1.40 | −0.219 |
| 0.75 | −0.556 | 0.75 | −0.743 | 1.50 | −0.246 |

TABLE 1-continued

| R | sagAX (mm) | R | sagAY (mm) | R | sagB (mm) |
|---|---|---|---|---|---|
| 0.80 | −0.632 | 0.80 | −0.843 | 1.60 | −0.273 |
| 0.85 | −0.712 | 0.85 | −0.950 | 1.70 | −0.300 |
| 0.90 | −0.797 | 0.90 | −1.062 | 1.80 | −0.327 |
| 0.95 | −0.887 | 0.95 | −1.181 | 1.90 | −0.353 |
| 1.00 | −0.981 | 1.00 | −1.305 | 2.00 | −0.379 |
| 1.05 | −1.080 | 1.05 | −1.435 | 2.10 | −0.405 |
| 1.10 | −1.183 | 1.10 | −1.570 | 2.20 | −0.431 |
| 1.15 | −1.291 | 1.15 | −1.711 | 2.30 | −0.456 |
| 1.20 | −1.403 | 1.20 | −1.858 | 2.40 | −0.481 |
| 1.25 | −1.520 | 1.25 | −2.010 | 2.50 | −0.506 |
| 1.30 | −1.640 | 1.30 | −2.167 | 2.60 | −0.531 |
| 1.35 | −1.765 | 1.35 | −2.329 | 2.70 | −0.557 |
| 1.40 | −1.895 | 1.40 | −2.496 | 2.80 | −0.582 |
| 1.45 | −2.028 | 1.45 | −2.669 | 2.90 | −0.607 |
| 1.50 | −2.166 | 1.50 | −2.846 | 3.00 | −0.633 |
| 1.55 | −2.307 | 1.55 | −3.028 | 3.10 | −0.658 |
| 1.60 | −2.453 | 1.60 | −3.214 | 3.20 | −0.684 |
| 1.65 | −2.602 | 1.65 | −3.406 | 3.30 | −0.711 |
| 1.70 | −2.755 | 1.70 | −3.601 | 3.40 | −0.738 |
| 1.75 | −2.912 | 1.75 | −3.801 | 3.50 | −0.765 |
| 1.80 | −3.073 | 1.80 | −4.005 | 3.60 | −0.793 |
| 1.85 | −3.238 | 1.83 | −4.150 | 3.70 | −0.822 |
| 1.90 | −3.406 | 1.87 | −4.300 | 3.80 | −0.851 |
| 1.95 | −3.578 | | | 3.90 | −0.881 |
| 2.00 | −3.754 | | | 4.00 | −0.912 |
| 2.05 | −3.933 | | | 4.10 | −0.944 |
| 2.10 | −4.115 | | | 4.20 | −0.977 |
| 2.11 | −4.150 | | | 4.30 | −1.012 |
| 2.15 | −4.300 | | | 4.40 | −1.047 |
| | | | | 4.50 | −1.085 |
| | | | | 4.60 | −1.124 |
| | | | | 4.70 | −1.164 |
| | | | | 4.80 | −1.207 |
| | | | | 4.90 | −1.251 |
| | | | | 5.00 | −1.298 |
| | | | | 5.10 | −1.346 |
| | | | | 5.20 | −1.397 |
| | | | | 5.30 | −1.449 |
| | | | | 5.40 | −1.505 |
| | | | | 5.50 | −1.562 |
| | | | | 5.60 | −1.623 |
| | | | | 5.70 | −1.686 |
| | | | | 5.80 | −1.753 |
| | | | | 5.90 | −1.823 |
| | | | | 6.00 | −1.897 |
| | | | | 6.10 | −1.975 |
| | | | | 6.20 | −2.058 |
| | | | | 6.30 | −2.146 |
| | | | | 6.40 | −2.241 |
| | | | | 6.50 | −2.343 |
| | | | | 6.60 | −2.452 |
| | | | | 6.70 | −2.570 |
| | | | | 6.80 | −2.699 |
| | | | | 6.90 | −2.840 |
| | | | | 7.00 | −2.995 |
| | | | | 7.10 | −3.170 |
| | | | | 7.20 | −3.370 |
| | | | | 7.30 | −3.601 |
| | | | | 7.40 | −3.877 |
| | | | | 7.50 | −4.213 |

Figure 7A:
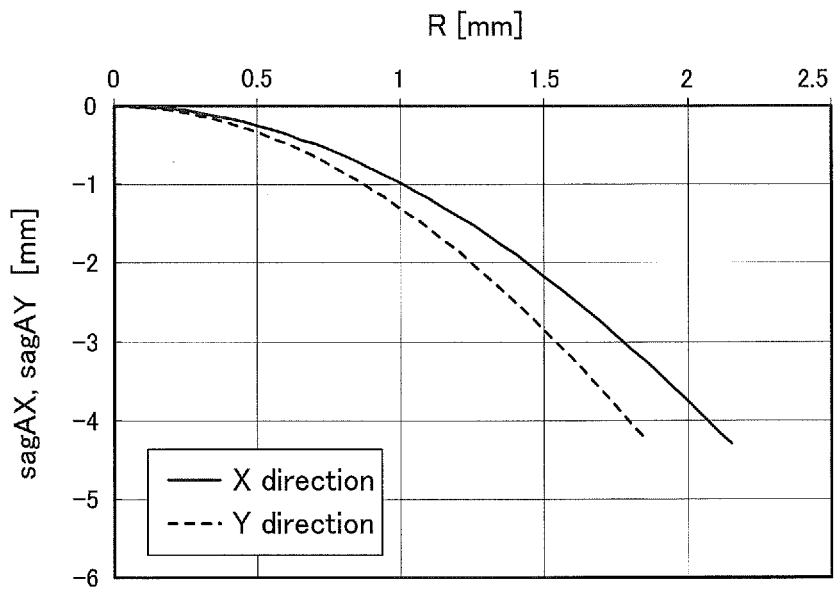
FIG. 7A is a graph representing the shape of the light entrance surface of the lens used for the light emitting device of Example 1 and showing the relationship between R, and sagAX and sagAY.
Figure 7B:
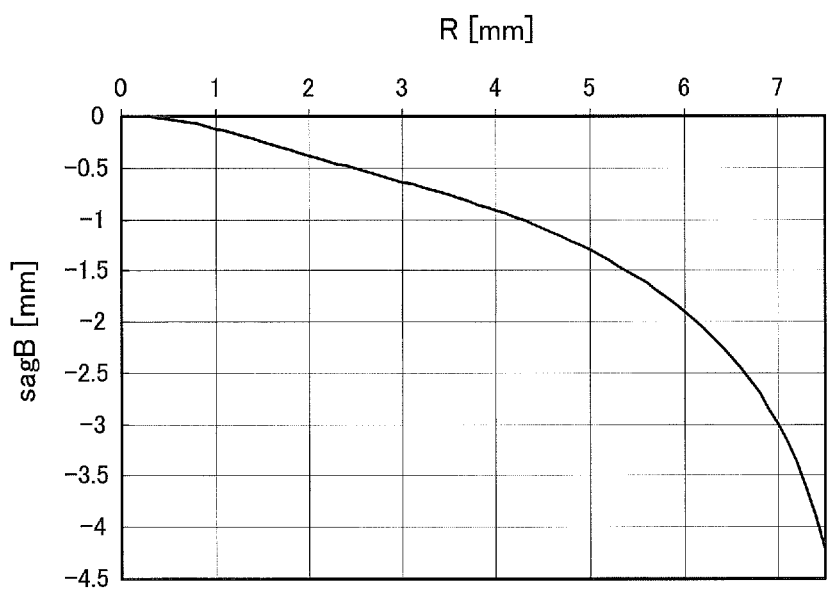
FIG. 7B is a graph representing the shape of the light exit surface of the same lens and showing the relationship between R and sagB (both graphs are obtained by plotting the values in Table 1).

FIG. 7A is a graph of R, sagAX and sagAY in Table 1, and FIG. 7B is a graph of R and sagB in Table 1.

Figure 8:
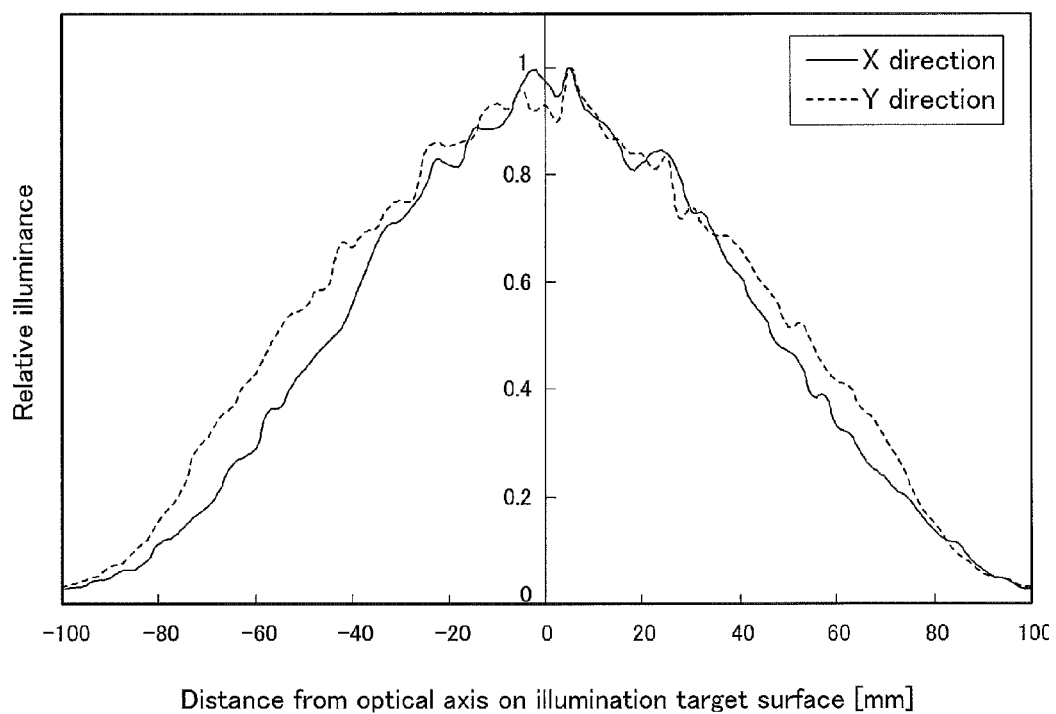
FIG. 8 shows illuminance distribution of the light emitting device of Example 1.
Figure 9:
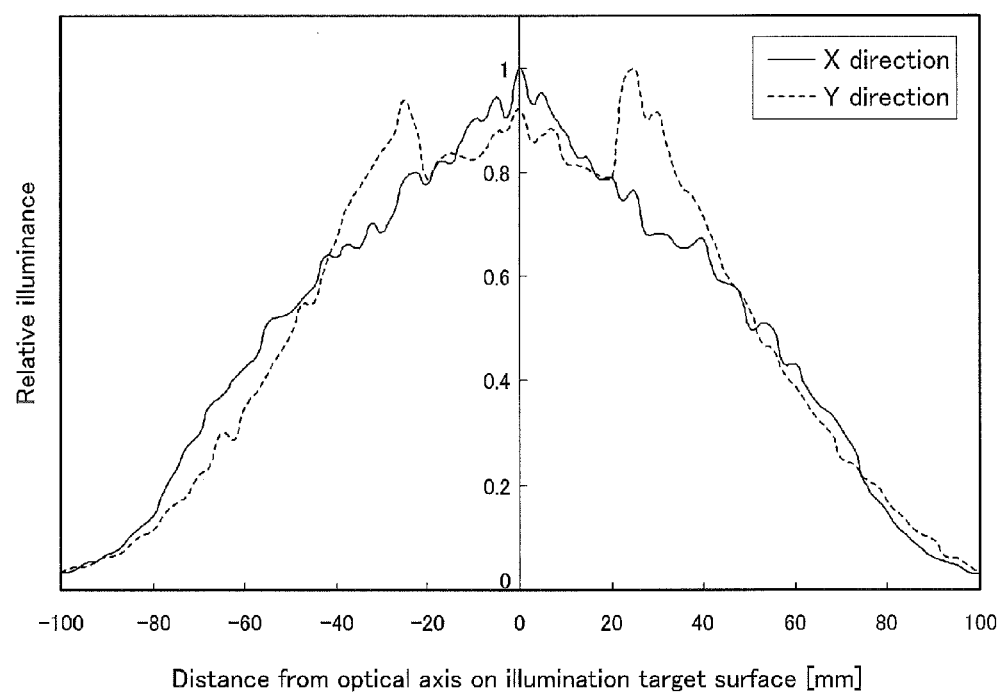
FIG. 9 shows illuminance distribution of a light emitting device having the same configuration as Example 1, except that the light entrance surface of the lens is rotationally symmetric.
Figure 10:
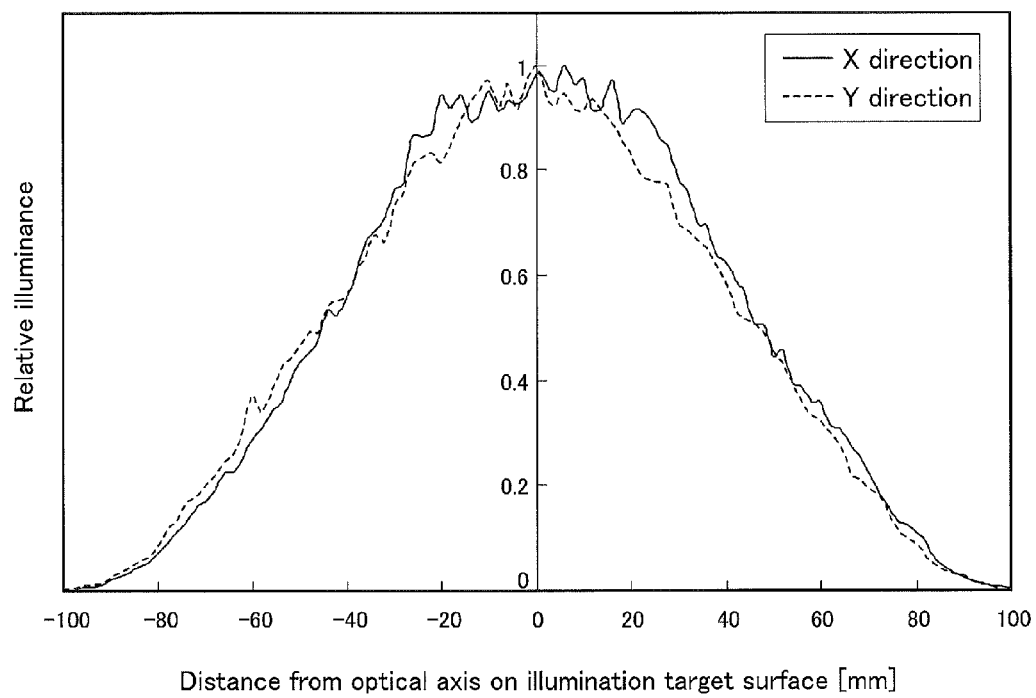
FIG. 10 shows illuminance distribution of a light emitting device having the same configuration as Example 1, except that the light entrance surface of the lens is rotationally symmetric and the lens is enlarged.

FIG. 8 shows illuminance distribution on the illumination target surface, calculated on the assumption that the light emitting device of Example 1 is used and the illumination target surface is arranged at a distance of 23 mm from the light emitting surface 21 of the light source 2. FIG. 9 shows illuminance distribution on the illumination target surface, calculated on the assumption that a light emitting device with the same configuration as Example 1, except that the light entrance surface of the lens is rotationally symmetric, is used and the illumination target surface is arranged at a distance of 23 mm from the light emitting surface 21 of the light source 2. FIG. 10 shows illuminance distribution on the illumination target surface, calculated on the assumption that a light emitting device with the same configuration as Example 1, except that the light entrance surface of the lens is rotationally symmetric and the lens has an enlarged effective diameter of 20 mm, is used and the illumination target surface is arranged at a distance of 23 mm from the light emitting surface 21 of the light source 2.

As shown in FIG. 10, in the case where a lens having the light entrance surface and the light exit surface that are rotationally symmetric is used together with the light source 2 having the light emitting surface 21 that is non-symmetric, there is not much difference in illuminance distribution on the illumination target surface between the X direction and the Y direction when the effective diameter of the lens is as large as 20 mm. However, when the effective diameter of the lens is reduced to 15 mm, there occurs a significant difference in illuminance distribution on the illumination target surface between the X direction and the Y direction, as shown in FIG. 9. In contrast, Example 1 uses the lens 3 having a greater refractive power in the Y direction than in the X direction, and thus allows similar illuminance distributions on the illuminated surface between the X direction and the Y direction, even if the lens 3 has a small effective diameter of 15 mm, as shown in FIG. 8.

Example 2

Figure 11A:
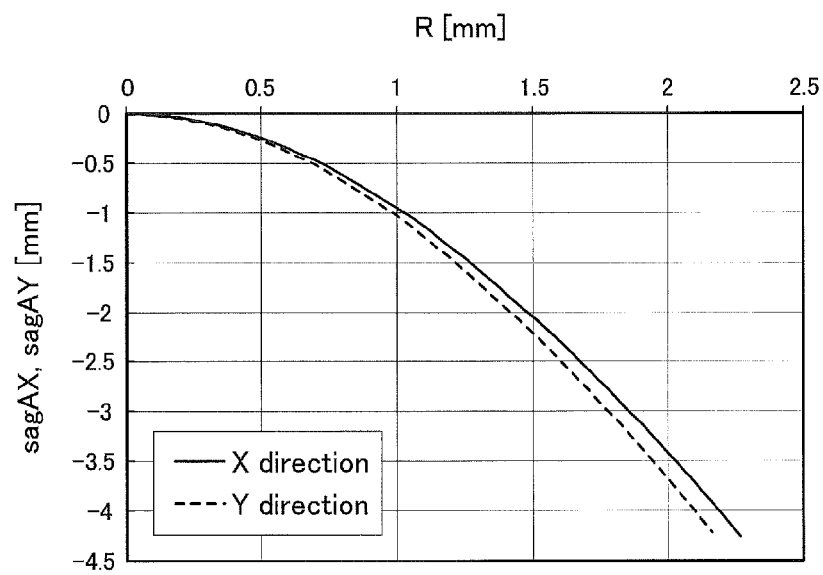
FIG. 11A is a graph representing the shape of the light entrance surface of the lens used for the light emitting device of Example 2 and showing the relationship between R, and sagAX and sagAY.
Figure 11B:
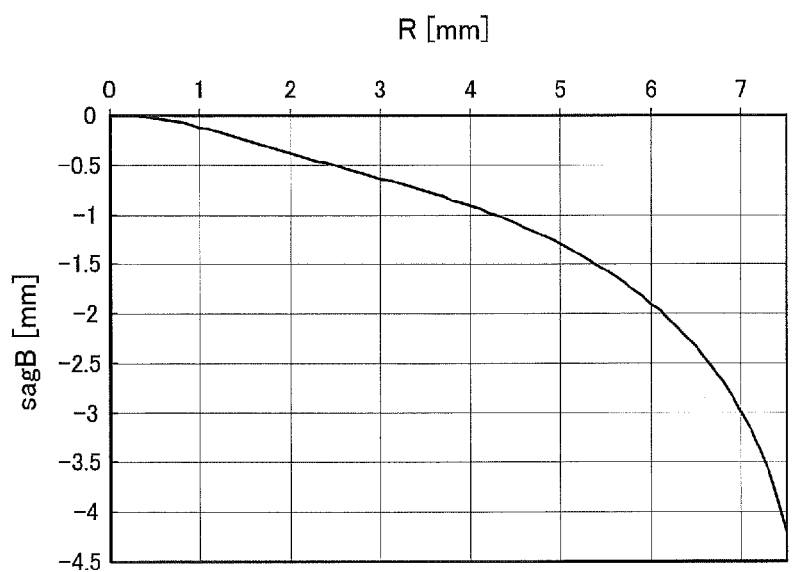
FIG. 11B is a graph representing the shape of the light exit surface of the same lens and showing the relationship between R and sagB.

Example 2 is a design example intended to widen the directionality of the light from the light source 2 by employing, as the light source 2, a general-purpose LED in which the light emitting surface 21 has a length of 2.20 mm in the X direction, and the light emitting surface 21 has a width of 1.10 mm in the Y direction. In Example 2, the lens 3 has an effective diameter of 15 mm. FIGS. 11A and 11B respectively show the shape of the light entrance surface and the shape of the light exit surface of the lens 3 used for the light emitting device of Example 2.

Figure 12:
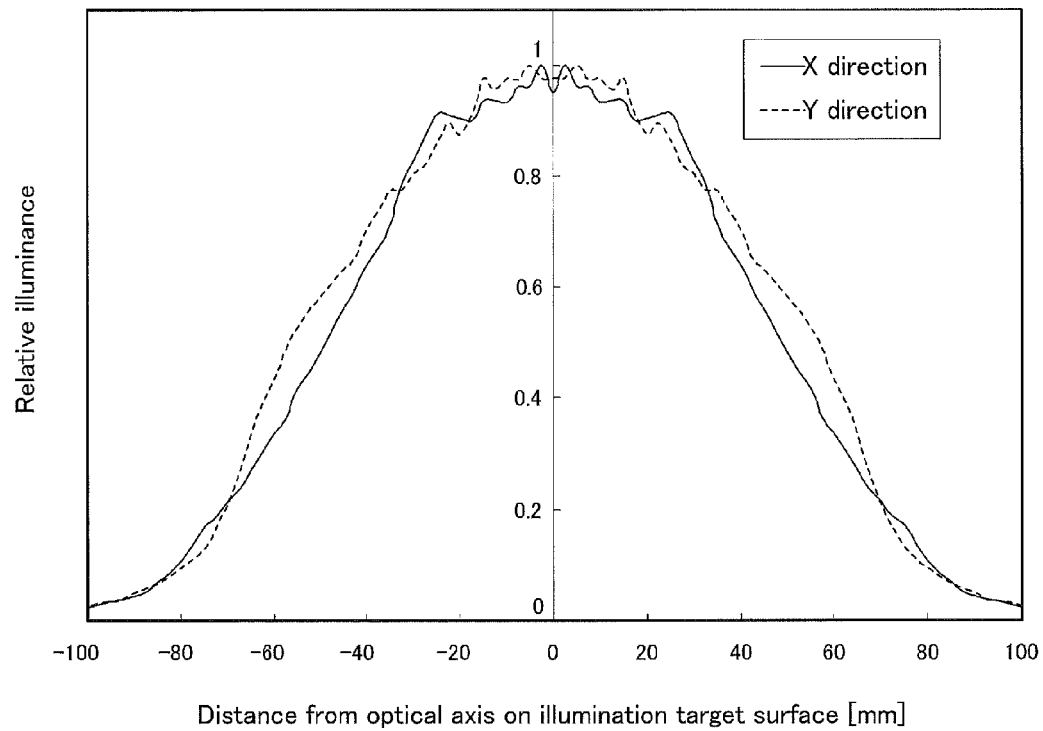
FIG. 12 shows illuminance distribution of the light emitting device of Example 2.

FIG. 12 shows illuminance distribution on the illumination target surface, calculated on the assumption that the light emitting device of Example 2 is used and the illumination target surface is arranged at a distance of 23 mm from the light emitting surface 21 of the light source 2.

As shown in FIG. 12, Example 2 also allows similar illuminance distributions on the illuminated surface between the X direction and the Y direction, as Example 1, even if the lens 3 has a small effective diameter of 15 mm.

Example 3

Figure 13A:
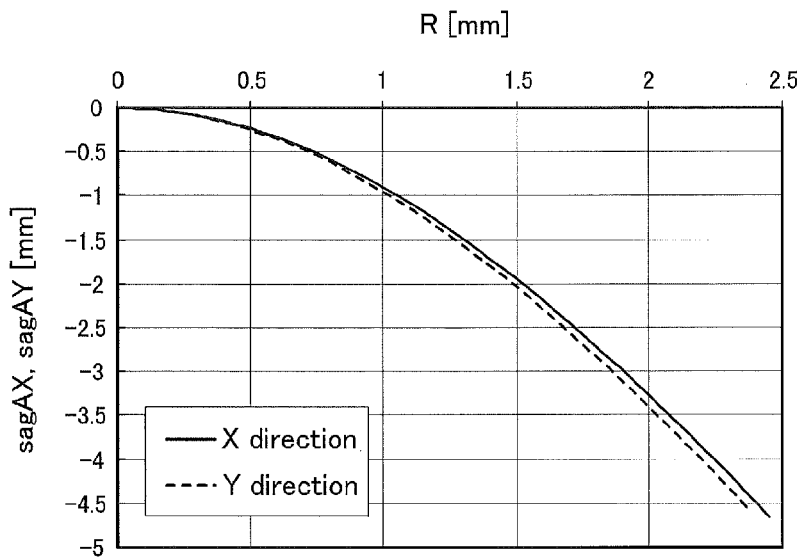
FIG. 13A is a graph representing the shape of the light entrance surface of the lens used for the light emitting device of Example 3 and showing the relationship between R, and sagAX and sagAY.
Figure 13B:
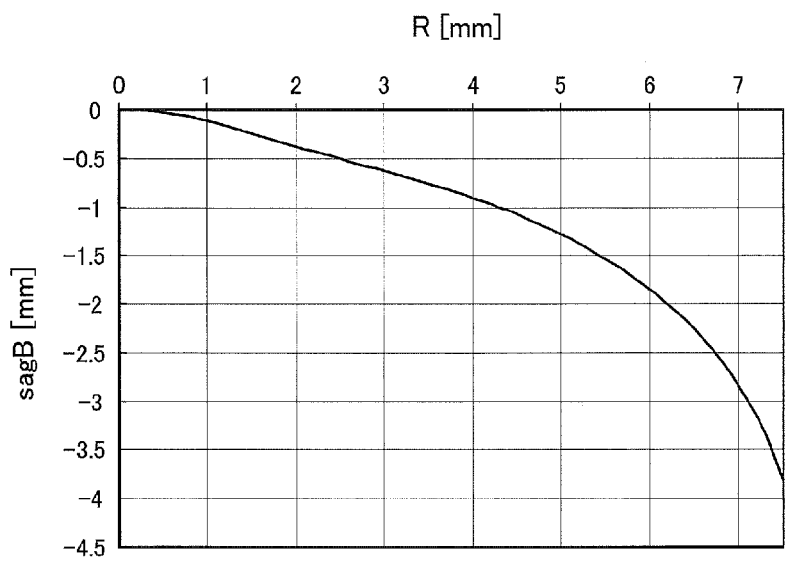
FIG. 13B is a graph representing the shape of the light exit surface of the same lens and showing the relationship between R and sagB.
Figure 14:
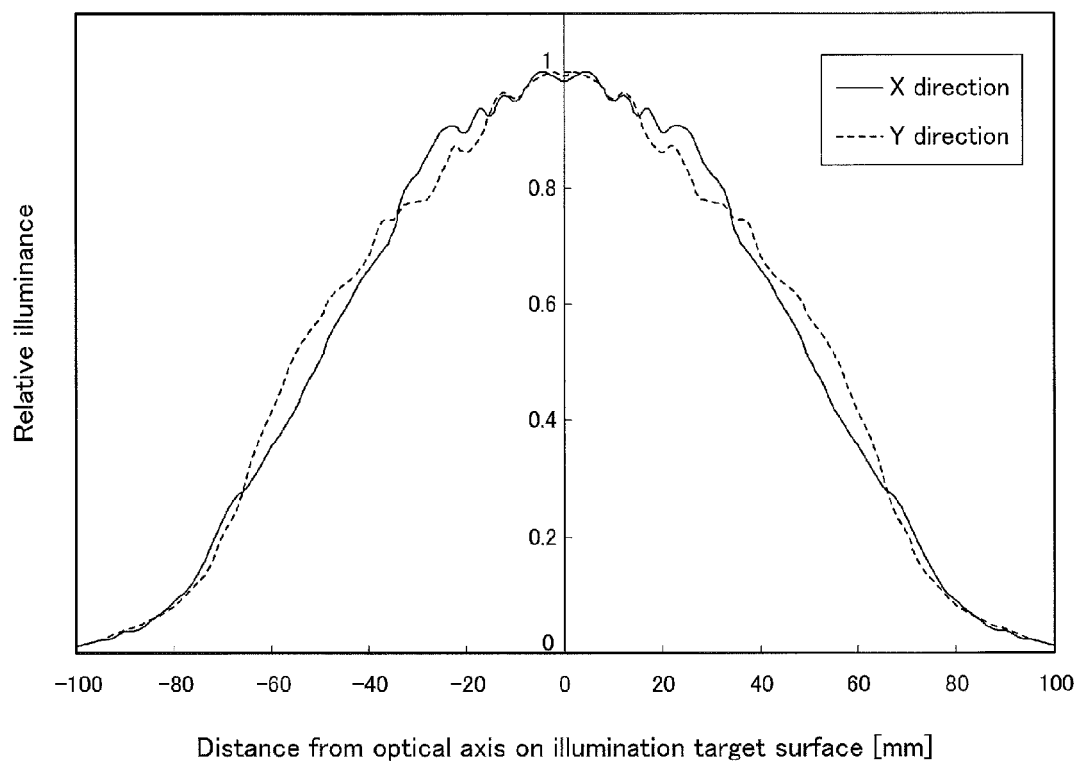
FIG. 14 shows illuminance distribution of the light emitting device of Example 3.

Example 3 is a design example intended to widen the directionality of the light from the light source 2 by employing, as the light source 2, a general-purpose LED in which the light emitting surface 21 has a length of 2.07 mm in the X direction, and the light emitting surface 21 has a width of 1.17 mm in the Y direction. In Example 3, the lens 3 has an effective diameter of 15 mm. FIGS. 13A and 13B respectively show the shape of the light entrance surface and the shape of the light exit surface of the lens 3 used for the light emitting device of Example 3. FIG. 14 shows illuminance distribution on the illumination target surface, calculated on the assumption that the light emitting device of Example 2 is used and the illumination target surface is arranged at a distance of 23 mm from the light emitting surface 21 of the light source 2.

As shown in FIG. 14, Example 3 also allows similar illuminance distributions on the illuminated surface between the X direction and the Y direction, as Example 1, even if the lens 3 has a small effective diameter of 15 mm.

Example 4

Figure 15A:
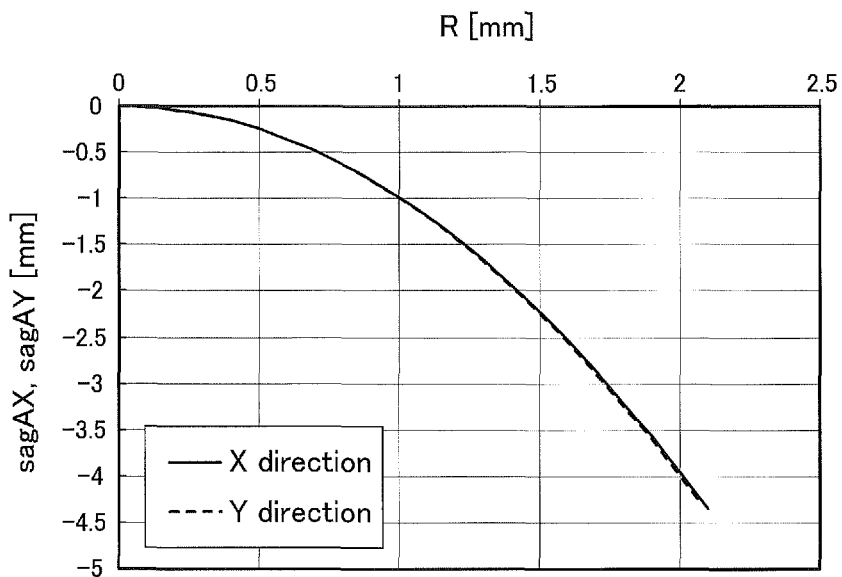
FIG. 15A is a graph representing the shape of the light entrance surface of the lens used for the light emitting device of Example 4 and showing the relationship between R, and sagAX and sagAY.
Figure 15B:
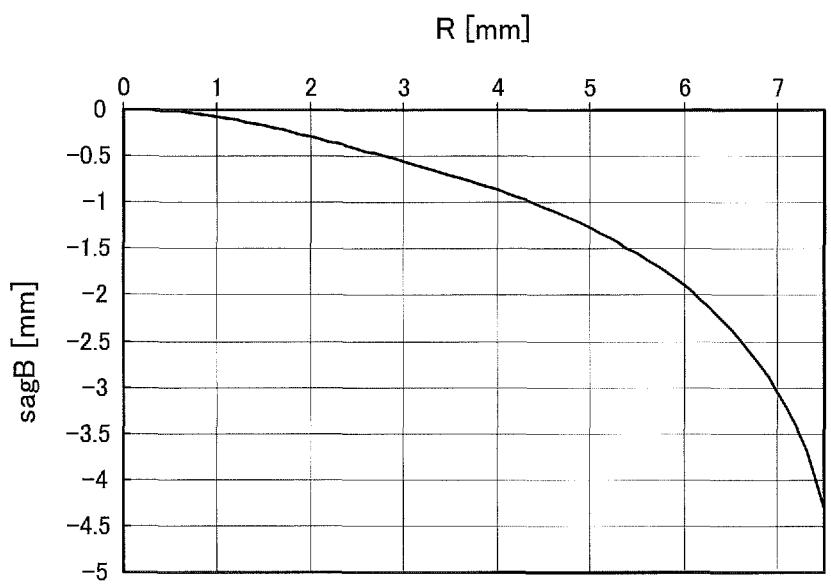
FIG. 15B is a graph representing the shape of the light exit surface of the same lens and showing the relationship between R and sagB.
Figure 16:
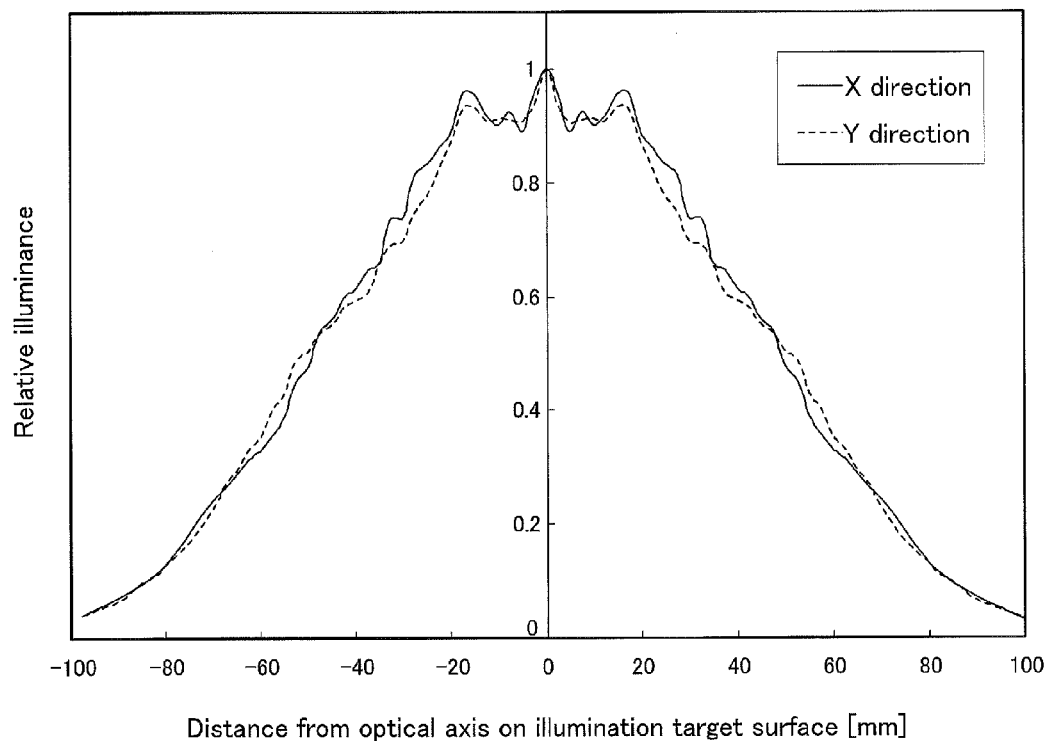
FIG. 16 shows illuminance distribution of the light emitting device of Example 4.

Example 4 is a design example intended to widen the directionality of the light from the light source 2 by employing, as the light source 2, a general-purpose LED in which the light emitting surface 21 has a length of 1.80 mm in the X direction, and the light emitting surface 21 has a width of 1.35 mm in the Y direction. In Example 4, the lens 3 has an effective diameter of 15 mm. FIGS. 15A and 15B respectively show the shape of the light entrance surface and the shape of the light exit surface of the lens 3 used for the light emitting device of Example 4. FIG. 16 shows illuminance distribution on the illumination target surface, calculated on the assumption that the light emitting device of Example 4 is used and the illumination target surface is arranged at a distance of 23 mm from the light emitting surface 21 of the light source 2.

As shown in FIG. 16, Example 4 also allows similar illuminance distributions on the illuminated surface between the X direction and the Y direction, as Example 1, even if the lens 3 has a small effective diameter of 15 mm.

Meanwhile, the curves as shown in FIG. 17 are obtained for the sag difference sagD of the lens 3 in Examples 1 to 4 by first normalizing the distance R from the light source A with the maximum radius DY of the light entrance surface 31 in the Y direction to obtain a normalized distance, and then plotting the sag difference sagD in the range of the normalized distance of 0.5 or more. Approximated straight lines that are expressed by the formulae indicated in FIG. 17 are obtained by linearly approximating these curves using the least-squares method. By plotting these slopes of the approximated straight lines onto the graph of FIG. 18, it can be seen that the above-mentioned conditional expression is satisfied in Examples 1 to 4.

Figure 19A:
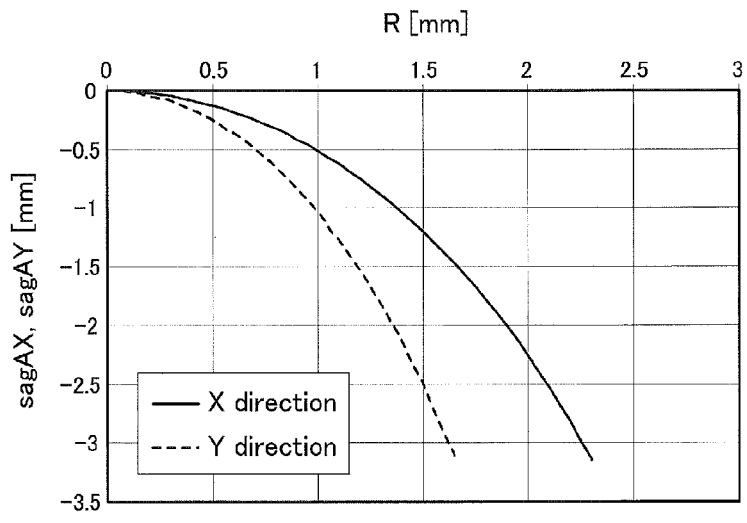
FIG. 19A is a graph representing the shape of the light entrance surface of the lens used for the light emitting device of Reference Example 1 and showing the relationship between R, and sagAX and sagAY.
Figure 20A:
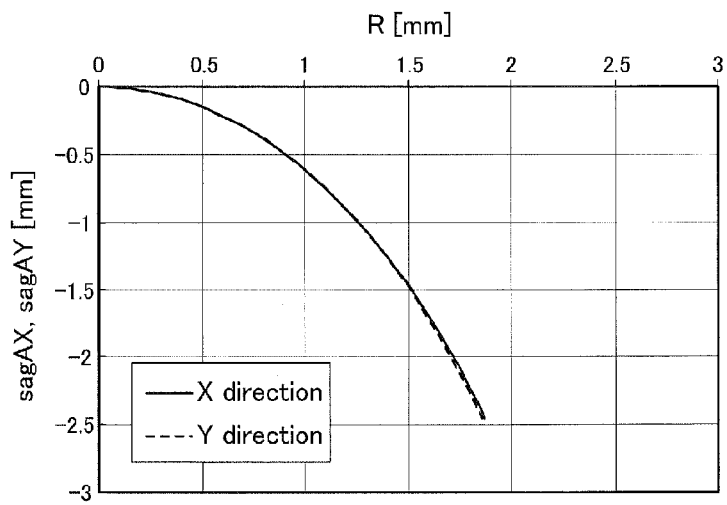
FIG. 20A is a graph representing the shape of the light entrance surface of the lens used for the light emitting device of Reference Example 2 and showing the relationship between R, and sagAX and sagAY.

As a reference, Reference Example 1 and Reference Example 2 in which the above-mentioned conditional expression is not satisfied are indicated in FIG. 18. Reference Example 1 and Reference Example 2 employ the lens 3 in which the entire area of the light entrance surface 31 is an anamorphic curved surface, and the light exit surface 32 is rotationally symmetric. However, in Reference Example 1, the anamorphic level is high, as shown in FIG. 19A, and in Reference Example 2, the anamorphic level is low, as shown in FIG. 20A. Further, the light emitting surface of the light source 2 has an aspect ratio of 2.0 in Reference Example 1, and the light emitting surface of the light source 2 has an aspect ratio of 2.8 in Reference Example 2. Reference Example 1 and Reference Example 2 both use the lens 3 having an effective diameter of 11 mm.

Figure 19B:
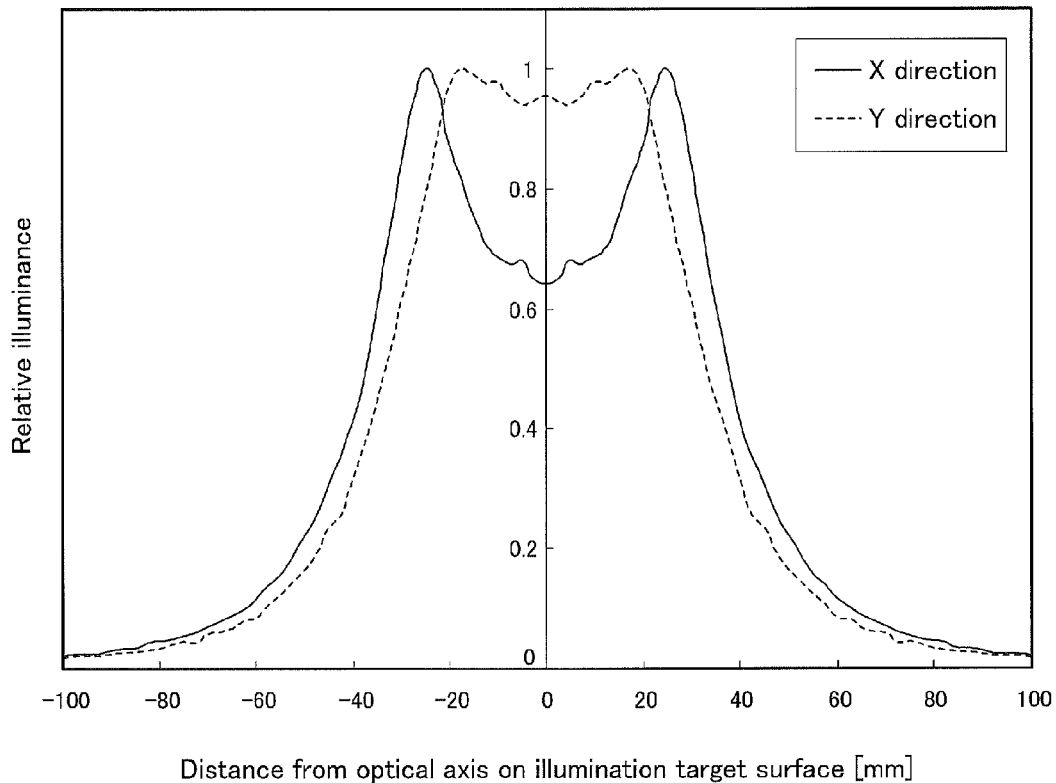
FIG. 19B shows illuminance distribution of the light emitting device of Reference Example 1.
Figure 20B:
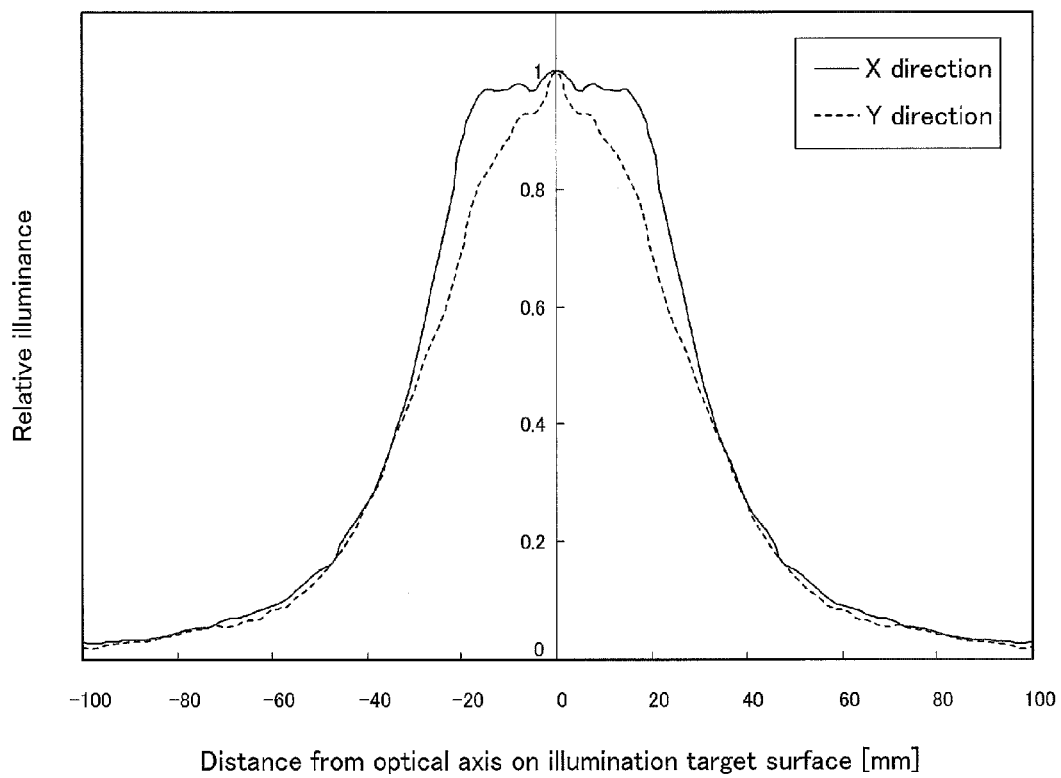
FIG. 20B shows illuminance distribution of the light emitting device of Reference Example 2.

The illuminance distribution of the light emitting device of Reference Example 1 is as shown in FIG. 19B, and the illuminance distribution of the light emitting device of Reference Example 2 is as shown in FIG. 20B. From these graphs, it can be seen that the shape of light distribution on the illumination target surface is deformed at an anamorphic level where the above-mentioned conditional expression is not satisfied.

Example 5

Example 5 is a design example intended to widen the directionality of the light from the light source 2 by employing, as the light source 2, a general-purpose LED in which the light emitting surface 21 has a length of 2.20 mm in the X direction, and the light emitting surface 21 has a width of 1.10 mm in the Y direction. In Example 5, the lens 3 has an effective diameter of 11 mm. Table 2 shows specific numerical values for Example 5.

TABLE 2

| R | sagA (mm) | R | sagBX (mm) | R | sagBY (mm) |
|---|---|---|---|---|---|
| 0.00 | 0.00000 | 0.00 | 0.000 | 0.00 | 0.000 |
| 0.05 | −0.00125 | 0.10 | 0.000 | 0.10 | 0.000 |
| 0.10 | −0.00500 | 0.20 | −0.001 | 0.20 | −0.001 |
| 0.15 | −0.01126 | 0.30 | −0.002 | 0.30 | −0.002 |
| 0.20 | −0.02002 | 0.40 | −0.004 | 0.40 | −0.004 |
| 0.25 | −0.03130 | 0.50 | −0.006 | 0.50 | −0.007 |
| 0.30 | −0.04510 | 0.60 | −0.009 | 0.60 | −0.011 |
| 0.35 | −0.06144 | 0.70 | −0.013 | 0.70 | −0.015 |
| 0.40 | −0.08032 | 0.80 | −0.018 | 0.80 | −0.020 |
| 0.45 | −0.10177 | 0.90 | −0.023 | 0.90 | −0.026 |
| 0.50 | −0.12579 | 1.00 | −0.030 | 1.00 | −0.033 |
| 0.55 | −0.15241 | 1.10 | −0.038 | 1.10 | −0.041 |
| 0.60 | −0.18165 | 1.20 | −0.047 | 1.20 | −0.051 |
| 0.65 | −0.21353 | 1.30 | −0.057 | 1.30 | −0.062 |
| 0.70 | −0.24808 | 1.40 | −0.068 | 1.40 | −0.074 |
| 0.75 | −0.28532 | 1.50 | −0.081 | 1.50 | −0.087 |
| 0.80 | −0.32529 | 1.60 | −0.095 | 1.60 | −0.102 |
| 0.85 | −0.36802 | 1.70 | −0.111 | 1.70 | −0.119 |
| 0.90 | −0.41355 | 1.80 | −0.127 | 1.80 | −0.137 |
| 0.95 | −0.46192 | 1.90 | −0.146 | 1.90 | −0.157 |
| 1.00 | −0.51317 | 2.00 | −0.165 | 2.00 | −0.178 |
| 1.05 | −0.56734 | 2.10 | −0.186 | 2.10 | −0.202 |
| 1.10 | −0.62450 | 2.20 | −0.208 | 2.20 | −0.226 |
| 1.15 | −0.68469 | 2.30 | −0.231 | 2.30 | −0.253 |
| 1.20 | −0.74797 | 2.40 | −0.256 | 2.40 | −0.281 |
| 1.25 | −0.81441 | 2.50 | −0.282 | 2.50 | −0.311 |
| 1.30 | −0.88408 | 2.60 | −0.309 | 2.60 | −0.343 |
| 1.35 | −0.95705 | 2.70 | −0.338 | 2.70 | −0.378 |
| 1.40 | −1.03340 | 2.80 | −0.368 | 2.80 | −0.414 |
| 1.45 | −1.11321 | 2.90 | −0.400 | 2.90 | −0.452 |
| 1.50 | −1.19659 | 3.00 | −0.433 | 3.00 | −0.493 |
| 1.55 | −1.28364 | 3.10 | −0.469 | 3.10 | −0.536 |
| 1.60 | −1.37446 | 3.20 | −0.506 | 3.20 | −0.581 |
| 1.65 | −1.46917 | 3.30 | −0.546 | 3.30 | −0.629 |
| 1.70 | −1.56792 | 3.40 | −0.589 | 3.40 | −0.681 |
| 1.75 | −1.67083 | 3.50 | −0.635 | 3.50 | −0.735 |
| 1.80 | −1.77808 | 3.60 | −0.684 | 3.60 | −0.792 |
| 1.85 | −1.88982 | 3.70 | −0.736 | 3.70 | −0.853 |
| 1.90 | −2.00625 | 3.80 | −0.792 | 3.80 | −0.917 |
| 1.95 | −2.12758 | 3.90 | −0.852 | 3.90 | −0.984 |
| 2.00 | −2.25403 | 4.00 | −0.916 | 4.00 | −1.055 |
| 2.05 | −2.38587 | 4.10 | −0.985 | 4.10 | −1.131 |
| 2.10 | −2.52337 | 4.20 | −1.058 | 4.20 | −1.210 |
| 2.15 | −2.66686 | 4.30 | −1.137 | 4.30 | −1.294 |
| 2.18 | −2.74995 | 4.40 | −1.220 | 4.40 | −1.383 |
| | | 4.50 | −1.310 | 4.50 | −1.477 |
| | | 4.60 | −1.407 | 4.60 | −1.578 |
| | | 4.70 | −1.512 | 4.70 | −1.687 |
| | | 4.80 | −1.625 | 4.80 | −1.804 |
| | | 4.90 | −1.750 | 4.90 | −1.932 |
| | | 5.00 | −1.888 | 5.00 | −2.073 |
| | | 5.10 | −2.041 | 5.10 | −2.230 |
| | | 5.20 | −2.212 | 5.20 | −2.406 |
| | | 5.30 | −2.405 | 5.30 | −2.605 |
| | | 5.40 | −2.623 | 5.39 | −2.800 |
| | | 5.47 | −2.800 | | |

Figure 22A:
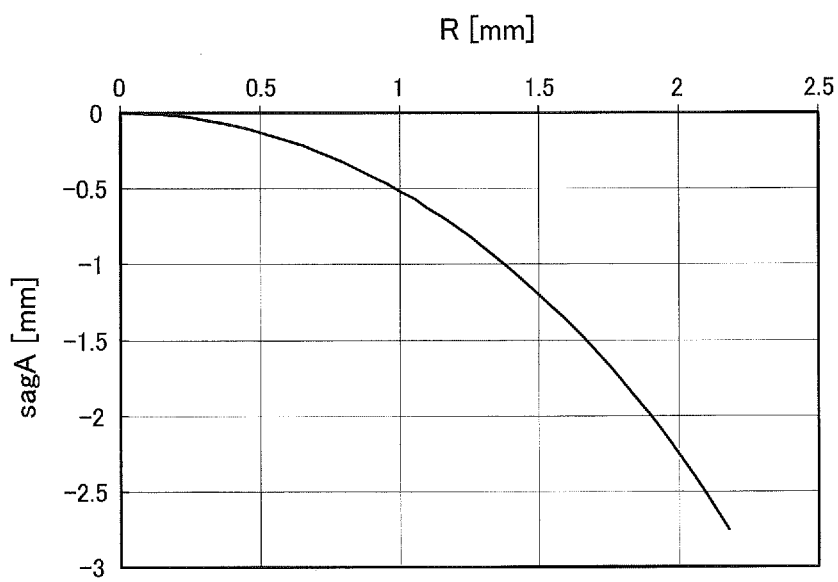
FIG. 22A is a graph representing the shape of the light entrance surface of the lens used for the light emitting device of Example 5 and showing the relationship between R and sagA.
Figure 22B:
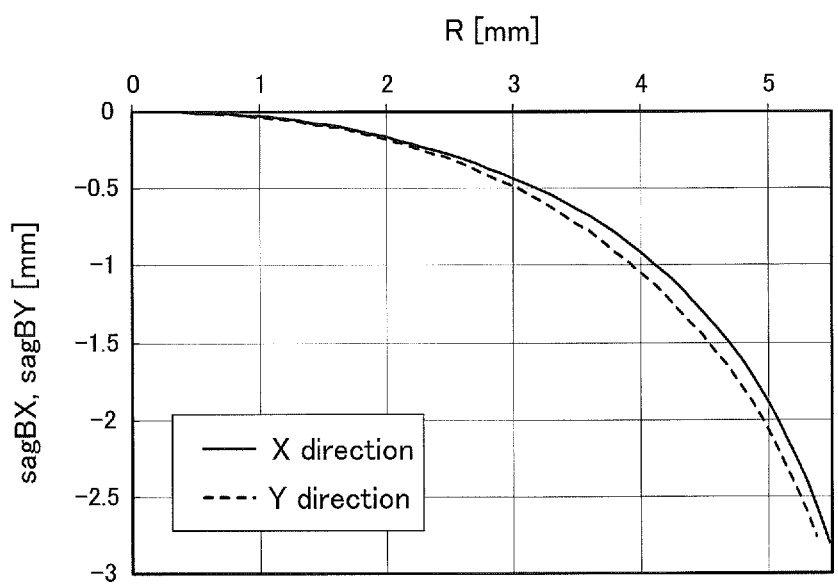
FIG. 22B is a graph representing the shape of the light exit surface of the same lens and showing the relationship between R, and sagBX and sagBY (both graphs are obtained by plotting the values in Table 2).

FIG. 22A is a graph of R and sagA in Table 2, and FIG. 22B is a graph of R, sagBX and sagBY in Table 2.

Figure 23:
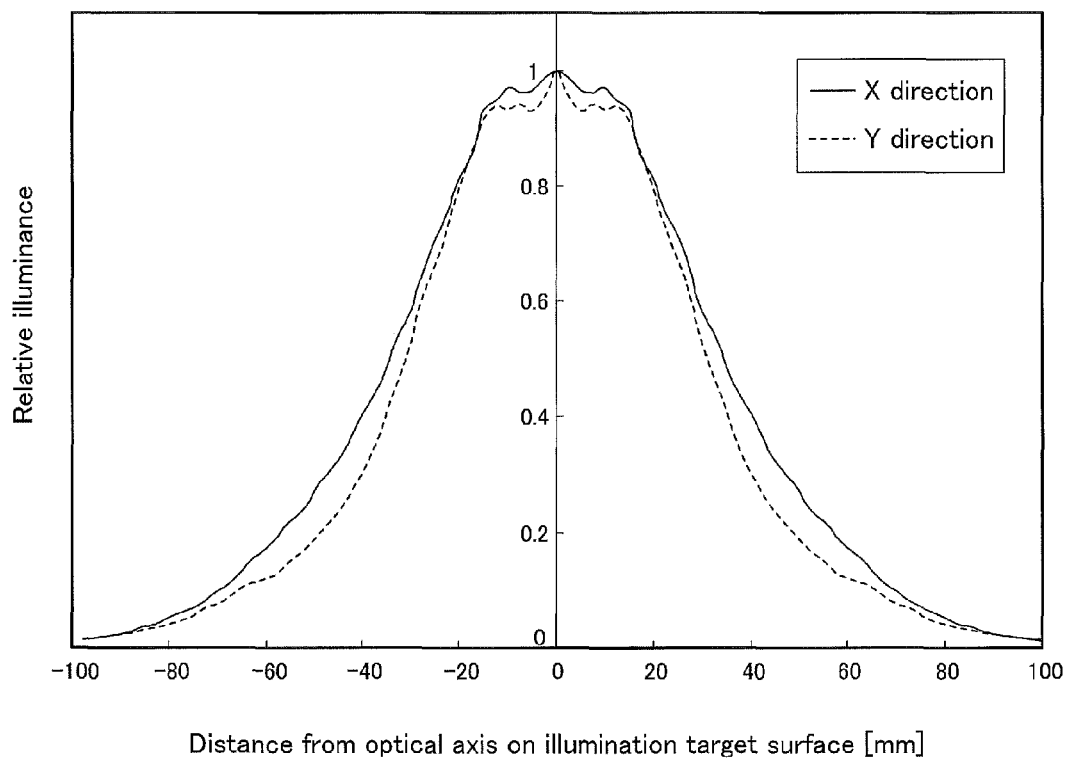
FIG. 23 shows illuminance distribution of the light emitting device of Example 5.
Figure 24:
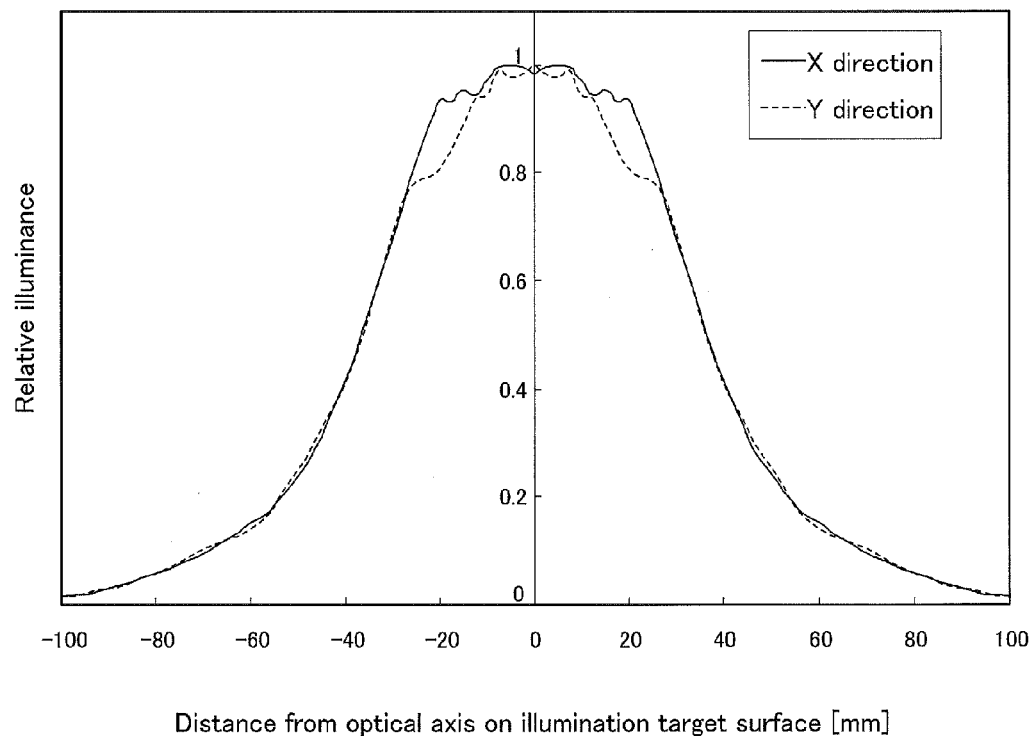
FIG. 24 shows illuminance distribution of a light emitting device having the same configuration as Example 5, except that the light exit surface of the lens is rotationally symmetric.

FIG. 23 shows illuminance distribution on the illumination target surface, calculated on the assumption that the light emitting device of Example 5 is used and the illumination target surface is arranged at a distance of 23 mm from the light emitting surface 21 of the light source 2. FIG. 24 shows illuminance distribution on the illumination target surface, calculated on the assumption that a light emitting device with the same configuration as Example 5, except that the light exit surface of the lens is rotationally symmetric, is used and the illumination target surface is arranged at a distance of 23 mm from the light emitting surface 21 of the light source 2. FIG.

25 shows illuminance distribution on the illumination target surface, calculated on the assumption that a light emitting device with the same configuration as Example 5, except that the light exit surface of the lens is rotationally symmetric and the lens has an enlarged effective diameter of 18 mm, is used and the illumination target surface is arranged at a distance of 23 mm from the light emitting surface 21 of the light source 2.

Figure 25:
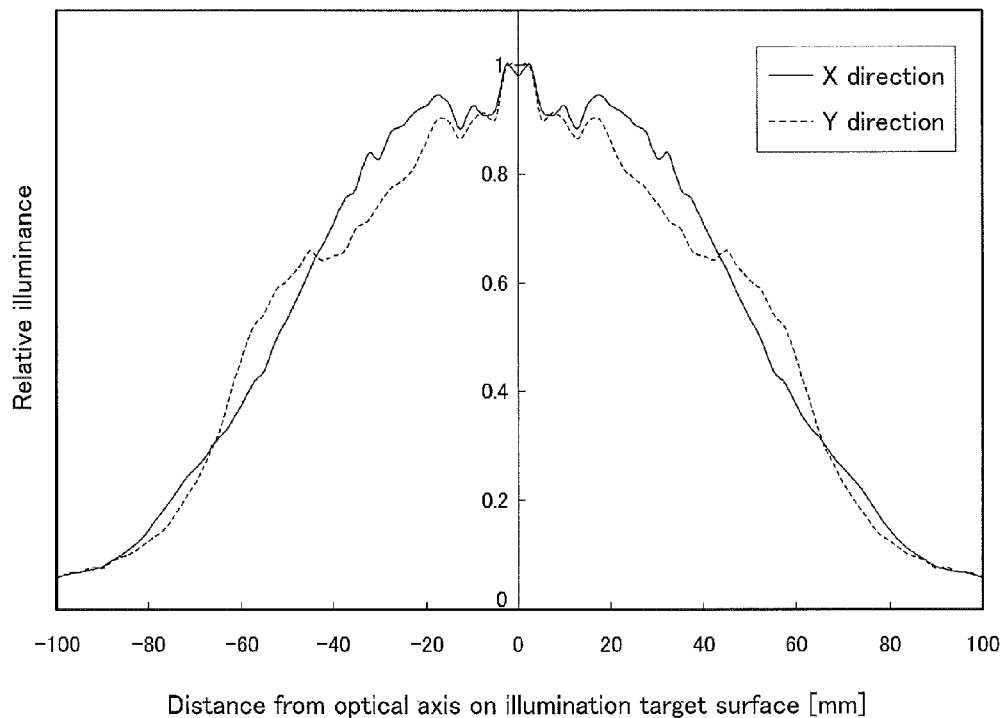
FIG. 25 shows illuminance distribution of a light emitting device having the same configuration as Example 5, except that the light exit surface of the lens is rotationally symmetric and the lens is enlarged.

As shown in FIG. 25, in the case where a lens having the light entrance surface and the light exit surface that are rotationally symmetric is used together with the light source 2 having the light emitting surface 21 that is non-symmetric, there is not much difference in illuminance distribution on the illumination target surface between the X direction and the Y direction when the effective diameter of the lens is as large as 18 mm. However, when the effective diameter of the lens is reduced to 11 mm, there occurs a significant difference in illuminance distribution on the illumination target surface between the X direction and the Y direction, as shown in FIG. 24. In contrast, Example 5 uses the lens 3 having a greater refractive power in the Y direction than in the X direction, and thus allows similar illuminance distributions on the illuminated surface between the X direction and the Y direction, even if the lens 3 has a small effective diameter of 11 mm, as shown in FIG. 23.

Embodiment 2

Figure 26:
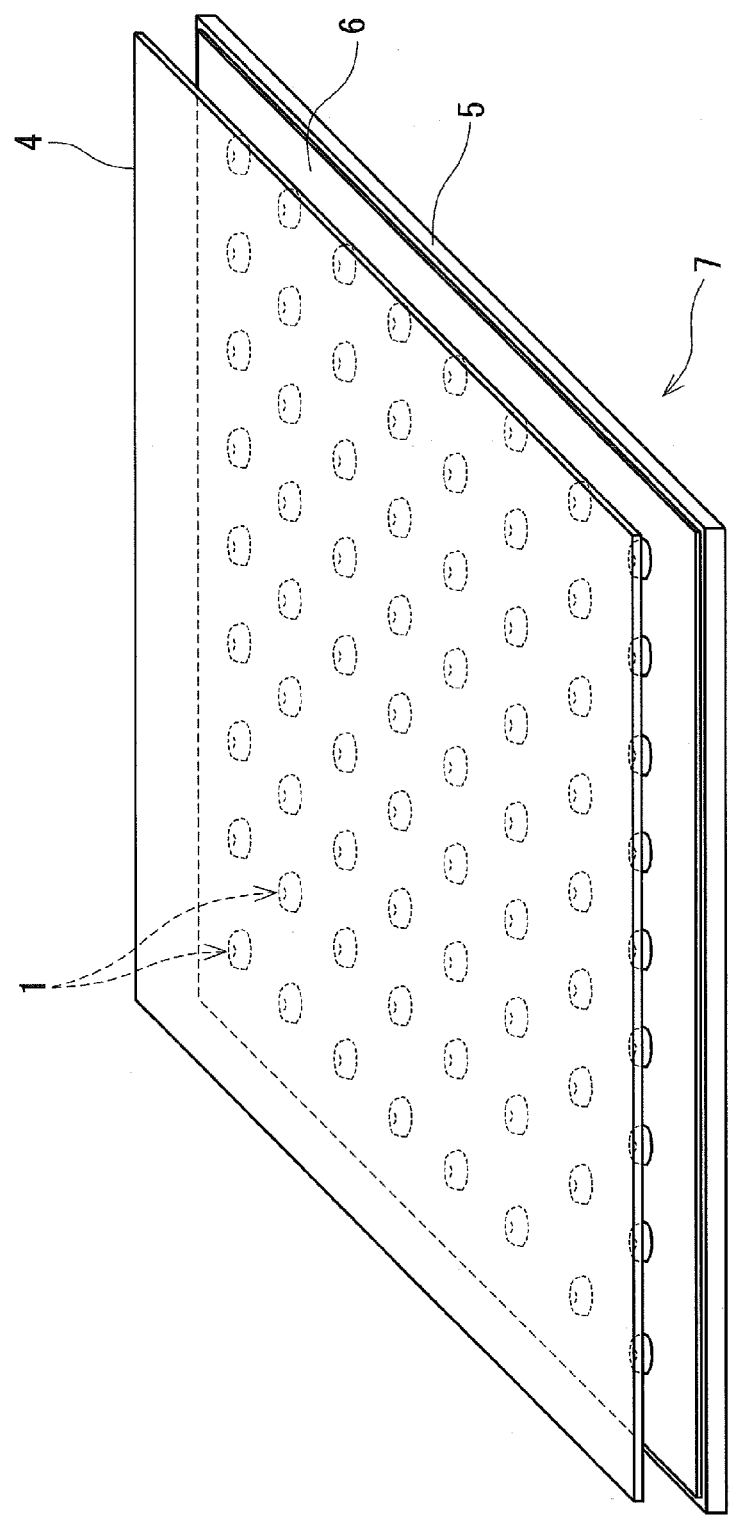
FIG. 26 is a schematic view showing a surface light source according to Embodiment 2 of the present invention.

FIG. 26 is a schematic view showing a surface light source 7 according to Embodiment 2 of the present invention. This surface light source 7 is provided with the plurality of light emitting devices 1 described in Embodiment 1 that are arranged in a plane, and a diffusing plate 4 disposed to cover these light emitting devices 1. The light emitting devices 1 may be arranged in a matrix, as shown in FIG. 26, or may be arranged in a staggered manner.

Figure 27:
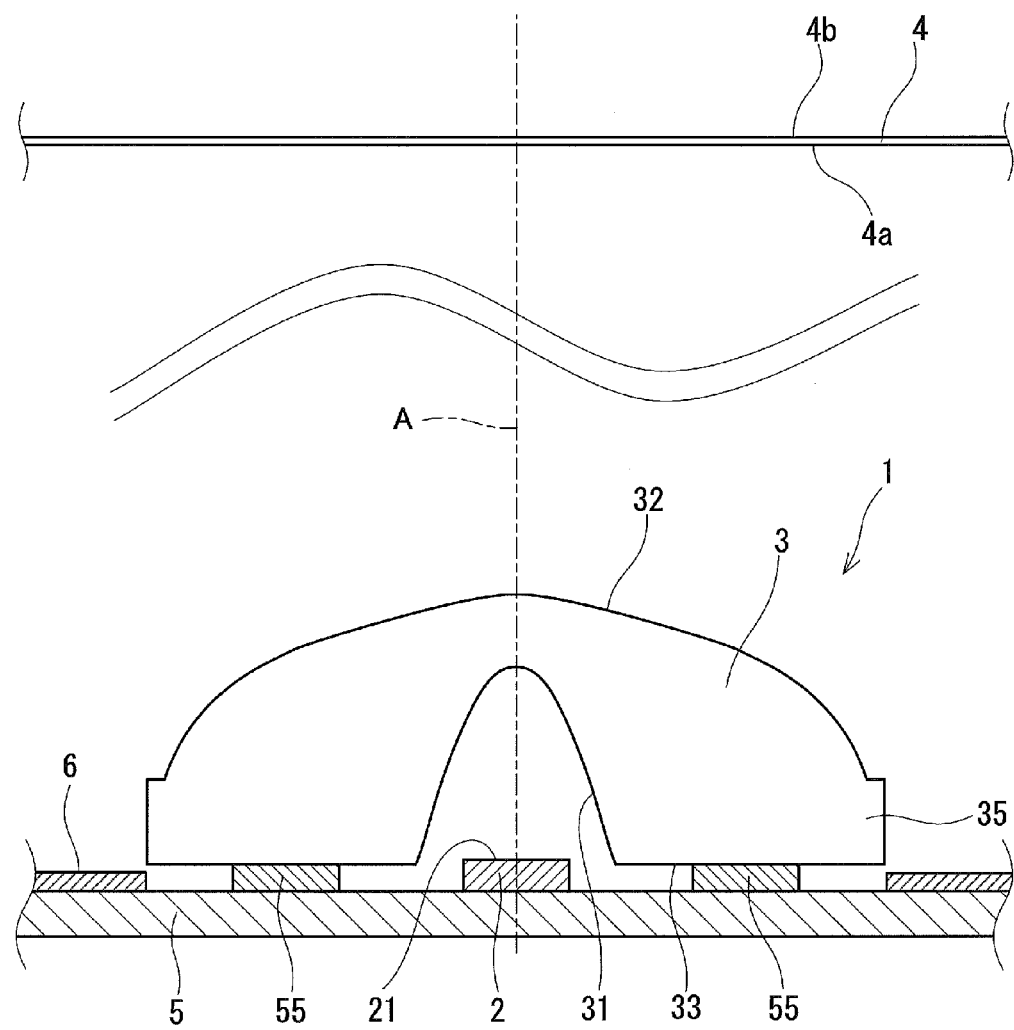
FIG. 27 is a partial sectional view of the surface light source shown in FIG. 26.

The surface light source 7 further is provided with a substrate 5 facing the diffusing plate 4 with the light emitting devices 1 interposed therebetween, as shown in FIG. 27. The light source 2 of each of the light emitting devices 1 is mounted on the substrate 5. In this embodiment, the bottom surface 33 of the lens 3 is joined to the substrate 5 via a support 55, and a reflecting plate 6 is disposed on the substrate 5 in such a way as to cover the substrate 5 while avoiding the light sources 2. The bottom surface 33 of the lens 3 need not necessarily be joined to the substrate 5 via the support 55, and may be bonded directly to the substrate 5. Further, the support 55 may be formed integrally with the lens 3.

The light emitting devices 1 illuminate one surface 4a of the diffusing plate 4 with light. That is, the one surface 4a of the diffusing plate 4 is the illumination target surface that has been described in Embodiment 1. The diffusing plate 4 allows the light that has been received on the one surface 4a to be radiated from its other surface 4b in a diffused state. Light with uniform illuminance is emitted from each of the light emitting devices 1 to the one surface 4a of the diffusing plate 4 over a large area. This light is diffused by the diffusing plate 4, thereby allowing a surface light source having less unevenness in in-plane brightness to be achieved.

The light from the light emitting devices 1 is scattered by the diffusing plate 4, some of which may be returned toward the light emitting devices and other parts of which may be transmitted through the diffusing plate 4. The light returned toward the light emitting devices to be incident on the reflecting plate 6 is reflected by the reflecting plate 6, so as to enter the diffusing plate 4 again.

Figure 28:
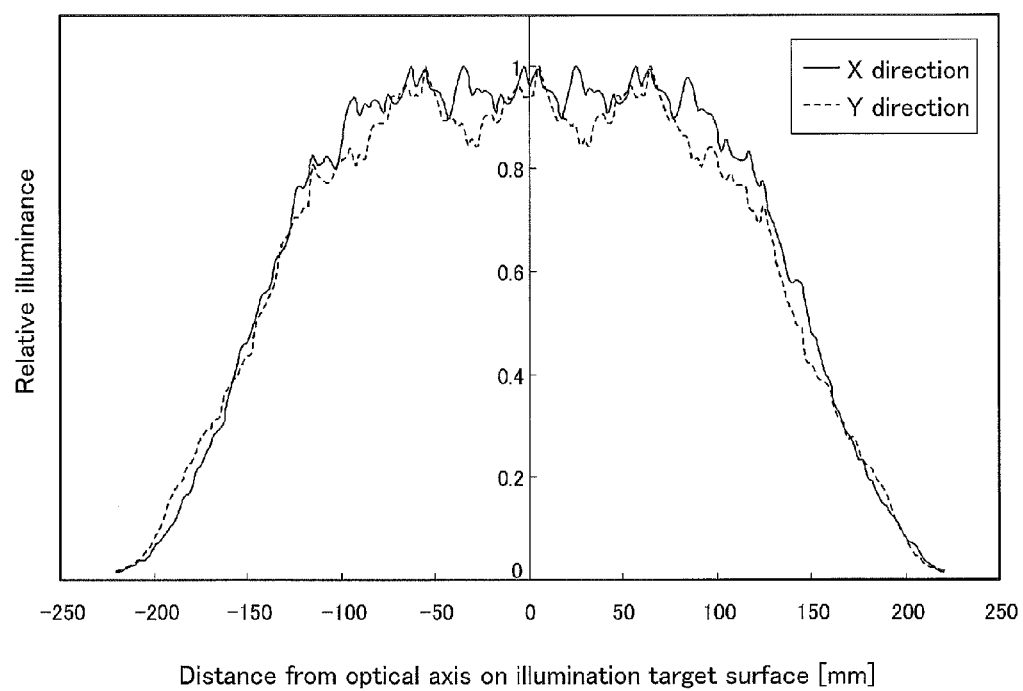
FIG. 28 shows illuminance distribution when the light emitting device of Example 1 is used in the surface light source in FIG. 26.

FIG. 28 shows illuminance distribution on the light entrance surface (the one surface on the light emitting device side) of the diffusing plate, calculated on the assumption that five light emitting devices of Example 1 using the lens 3 in which the entire area of the light entrance surface is an anamorphic curved surface are arranged in a straight line at a pitch of 60 mm, and the diffusing plate is arranged at a distance of 23 mm from the light emitting surfaces 21 of the light sources 2. Small fluctuations observed in the illuminance distribution are due to a shortage in the number of light rays to be evaluated in illuminance calculation.

Figure 29:
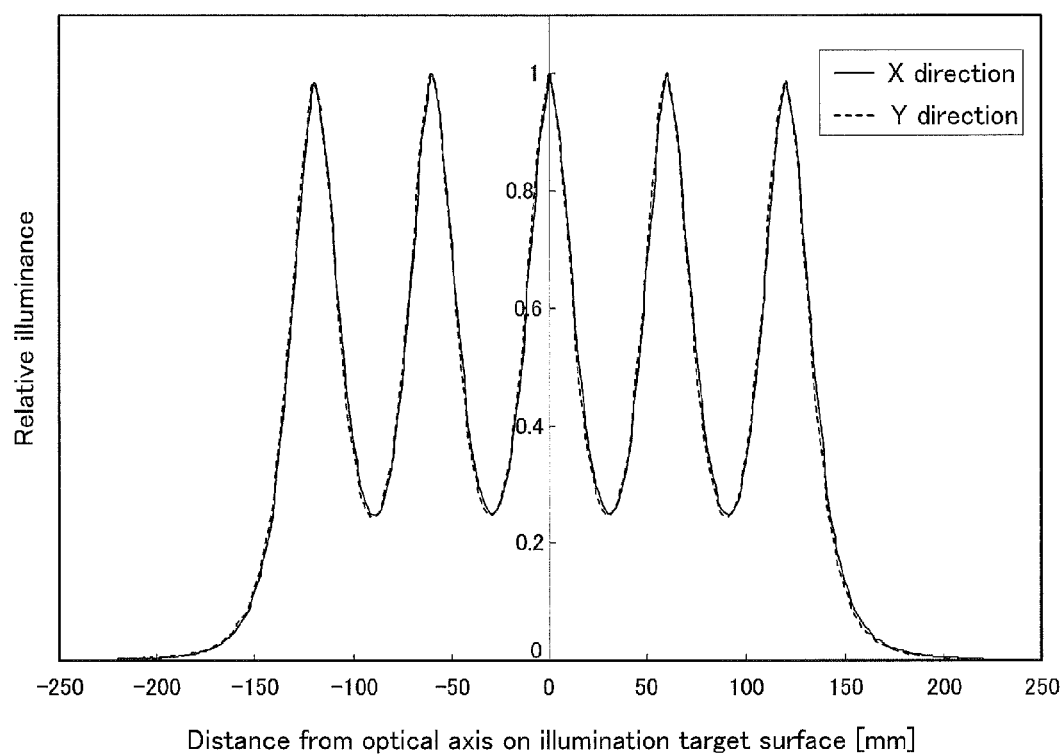
FIG. 29 shows illuminance distribution when the surface light source is constituted only by an LED, which demonstrates the effects of the light emitting device of Example 1.

FIG. 29 shows illuminance distribution on the light entrance surface of the diffusing plate, calculated on the assumption that five LEDs only are arranged in a straight line at a pitch of 60 mm, and the diffusing plate is arranged at a distance of 23 mm from the surface of the LEDs.

A comparison between FIG. 28 and FIG. 29 shows that uniform illumination is enabled on the light entrance surface of the diffusing plate due to the effect of the lens 3.

Embodiment 3

Figure 30:
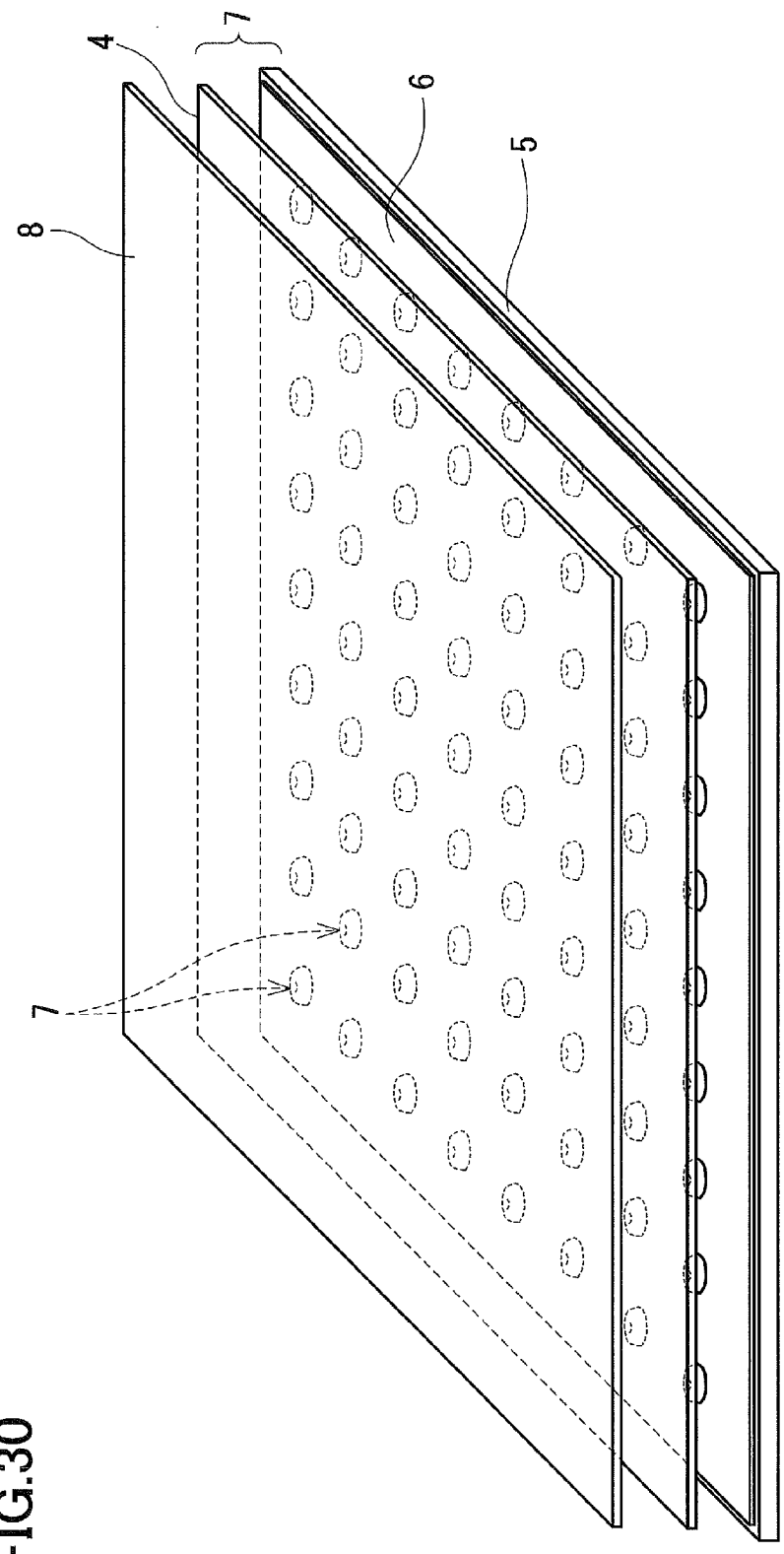
FIG. 30 is a schematic view showing a liquid crystal display apparatus according to Embodiment 3 of the present invention.

FIG. 30 is a schematic view showing a liquid crystal display apparatus according to Embodiment 3 of the present invention. This liquid crystal display apparatus is provided with a liquid crystal panel 8, and the surface light source 7 described in Embodiment 3 that is disposed behind the liquid crystal panel 8.

A plurality of light emitting devices 1 are arranged in a plane, and these light emitting devices 1 illuminate the diffusing plate 4. Light with uniform illuminance is received on the backside (one surface) of the diffusing plate 4. Then, this light is diffused by the diffusing plate 4 to illuminate the liquid crystal panel 8.

Preferably, an optical sheet such as a diffusing sheet and a prism sheet is disposed between the liquid crystal panel 8 and the surface light source 7. In this case, the light transmitted through the diffusing plate 4 is further diffused by the optical sheet, so as to illuminate the liquid crystal panel 8.

The invention claimed is:

1. A light emitting device comprising:
    a light source having a light emitting surface, the light emitting surface being non-symmetric with respect to an optical axis and extending in a first direction orthogonal to the optical axis; and
    a lens having a light entrance surface through which the light from the light source enters the lens and a light exit surface through which the light that has entered the lens exits the lens, wherein
    the light entrance surface of the lens is a concave surface including an anamorphic aspherical curved surface, and
    the lens has a greater refractive power in a second direction that is orthogonal to the first direction than in the first direction.

2. The light emitting device according to claim 1, wherein the anamorphic aspherical curved surface of the lens has a vertex on the optical axis, and
    when a distance along the optical axis from the vertex to a point on the anamorphic aspherical curved surface is taken as a sag amount, the sag amount in the first direction is greater than the sag amount in the second direction at the same distance from the optical axis in the radial direction.

3. The light emitting device according to claim 2, wherein a sag difference obtained by subtracting the sag amount in the second direction of the lens from the sag amount in the first direction of the lens increases as the distance from the optical axis increases.

4. The light emitting device according to claim 3, wherein when an aspect ratio of the light emitting surface that is a ratio of a length of the light emitting surface in the first direction of the lens with respect to a width of the light emitting surface in the second direction of the lens is referred to as F, and a slope of an approximated straight line obtained by first normalizing the distance from the optical axis with a maximum radius of the anamorphic aspherical curved surface in the second direction to obtain a normalized distance, and then linearly approximating a curve of the sag difference in the range of the normalized distance of 0.5 or more, using a least-squares method is referred to as S, the following conditional expression is satisfied:

$$0.12(F-1)^2 \leq S \leq 3\log_{10}F.$$

5. A surface light source comprising:
a plurality of light emitting devices arranged in a plane; and
a diffusing plate disposed to cover the plurality of light emitting devices, the diffusing plate allowing light emitted by the plurality of light emitting devices and received on its one surface to be radiated from its other surface in a diffused state,
wherein each of the plurality of light emitting devices is the light emitting device of claim 1.

6. A liquid crystal display apparatus comprising:
a liquid crystal panel; and
the surface light source of claim 5 disposed behind the liquid crystal panel.

* * * * *